United States Patent
Chiang et al.

(10) Patent No.: US 10,872,818 B2
(45) Date of Patent: Dec. 22, 2020

(54) BURIED POWER RAIL AND METHOD FORMING SAME

(71) Applicant: Taiwan Semiconductor Manufacturing Company, Ltd., Hsinchu (TW)

(72) Inventors: Kuo-Cheng Chiang, Zhubei (TW); Shi Ning Ju, Hsinchu (TW); Kuan-Lun Cheng, Hsinchu (TW); Chih-Hao Wang, Baoshan Township (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/293,858

(22) Filed: Mar. 6, 2019

(65) Prior Publication Data

US 2020/0135634 A1   Apr. 30, 2020

Related U.S. Application Data

(60) Provisional application No. 62/750,944, filed on Oct. 26, 2018.

(51) Int. Cl.
| | |
|---|---|
| *H01L 21/44* | (2006.01) |
| *H01L 29/40* | (2006.01) |
| *H01L 21/768* | (2006.01) |
| *H01L 29/417* | (2006.01) |
| *H01L 27/108* | (2006.01) |

(52) U.S. Cl.
CPC .. *H01L 21/76897* (2013.01); *H01L 21/76831* (2013.01); *H01L 27/10855* (2013.01); *H01L 29/41766* (2013.01)

(58) Field of Classification Search
CPC ................ H01L 21/76897; H01L 27/10855
USPC ............... 257/774; 438/666–668, 700–703
See application file for complete search history.

(56) References Cited

U.S. PATENT DOCUMENTS

| | | | |
|---|---|---|---|
| 6,566,177 B1 * | 5/2003 | Radens | H01L 27/10864 257/E21.652 |
| 8,492,821 B2 * | 7/2013 | Cheng | H01L 21/84 257/301 |
| 9,559,103 B2 * | 1/2017 | Park | H01L 27/10814 |
| 10,446,555 B2 * | 10/2019 | Wang | H01L 27/10823 |
| 2003/0207523 A1 | 11/2003 | Liu et al. | |
| 2015/0014775 A1 | 1/2015 | Seo et al. | |
| 2017/0278972 A1 | 9/2017 | Hsia et al. | |
| 2017/0294448 A1 | 10/2017 | Debacker et al. | |

(Continued)

FOREIGN PATENT DOCUMENTS

CN   108305835 A   7/2018

*Primary Examiner* — Calvin Lee
(74) *Attorney, Agent, or Firm* — Slater Matsil, LLP

(57) ABSTRACT

A method includes etching a semiconductor substrate to form two semiconductor strips. The two semiconductor strips are over a bulk portion of the semiconductor substrate. The method further includes etching the bulk portion to form a trench in the bulk portion of the semiconductor substrate, forming a liner dielectric layer lining the trench, forming a buried contact in the trench, forming a buried power rail over and connected to the buried contact, wherein the buried power rail is between the two semiconductor strips, and forming isolation regions on opposite sides of the two semiconductor strips. The buried power rail is underlying a portion of the isolation regions.

20 Claims, 34 Drawing Sheets

(56) References Cited

U.S. PATENT DOCUMENTS

2018/0026042 A1   1/2018  Smith et al.
2018/0145030 A1   5/2018  Beyne et al.
2018/0294267 A1  10/2018  Licausi et al.

* cited by examiner

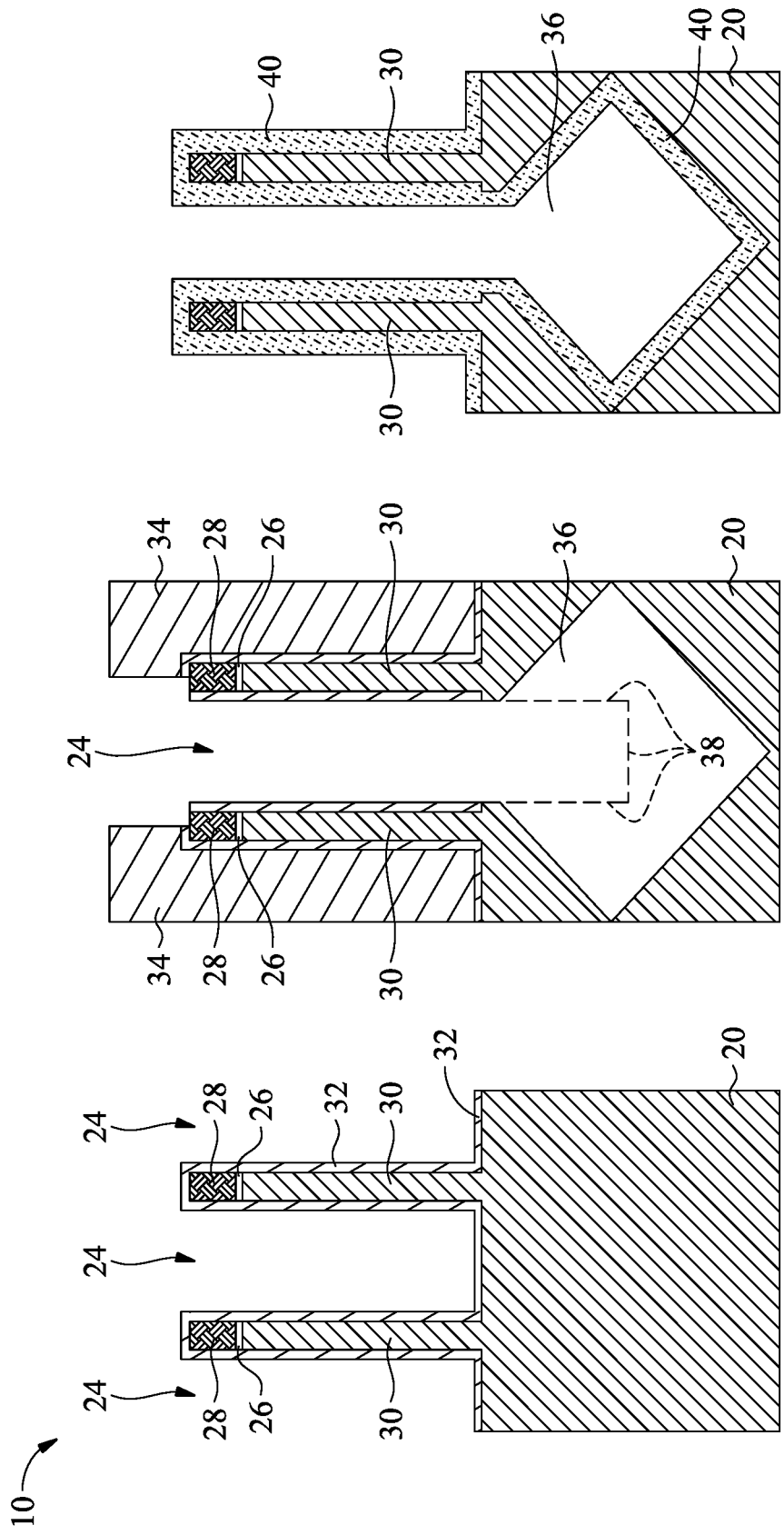

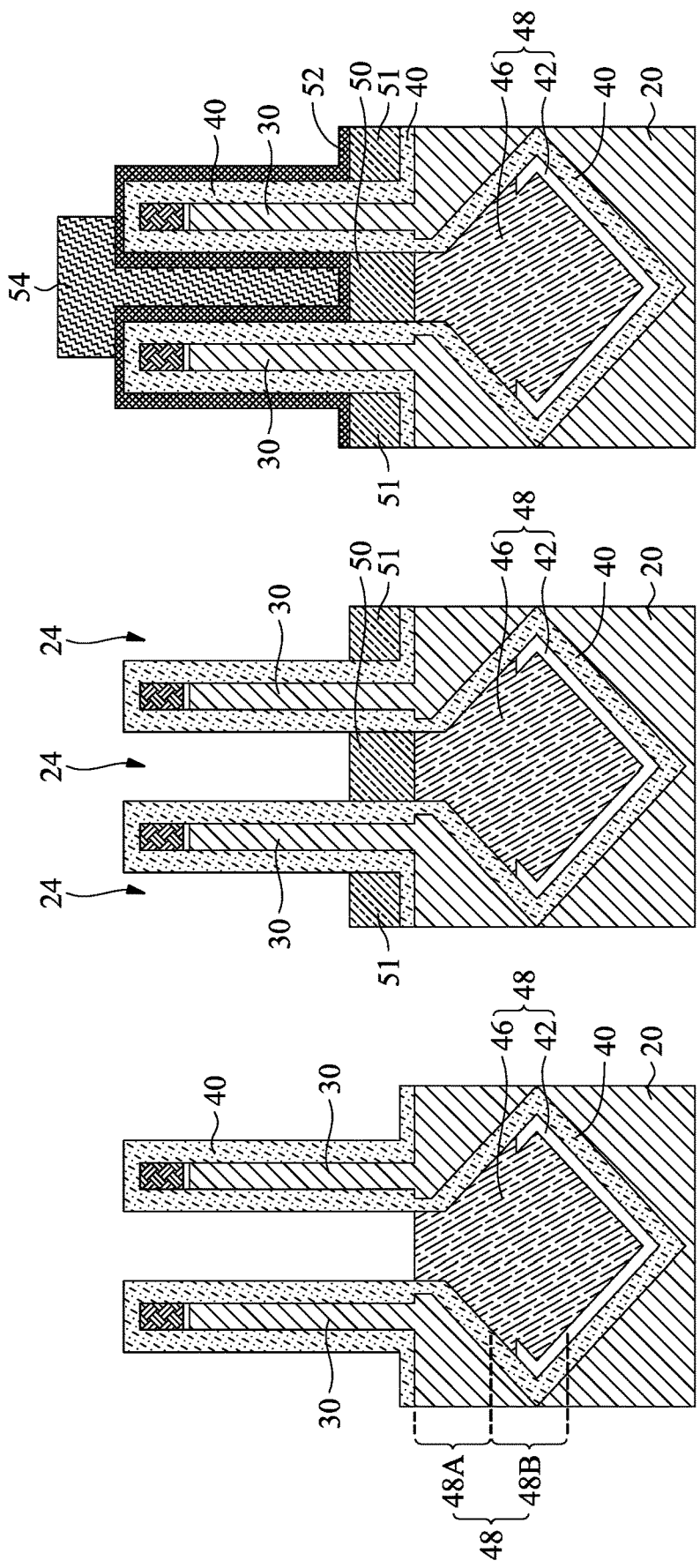

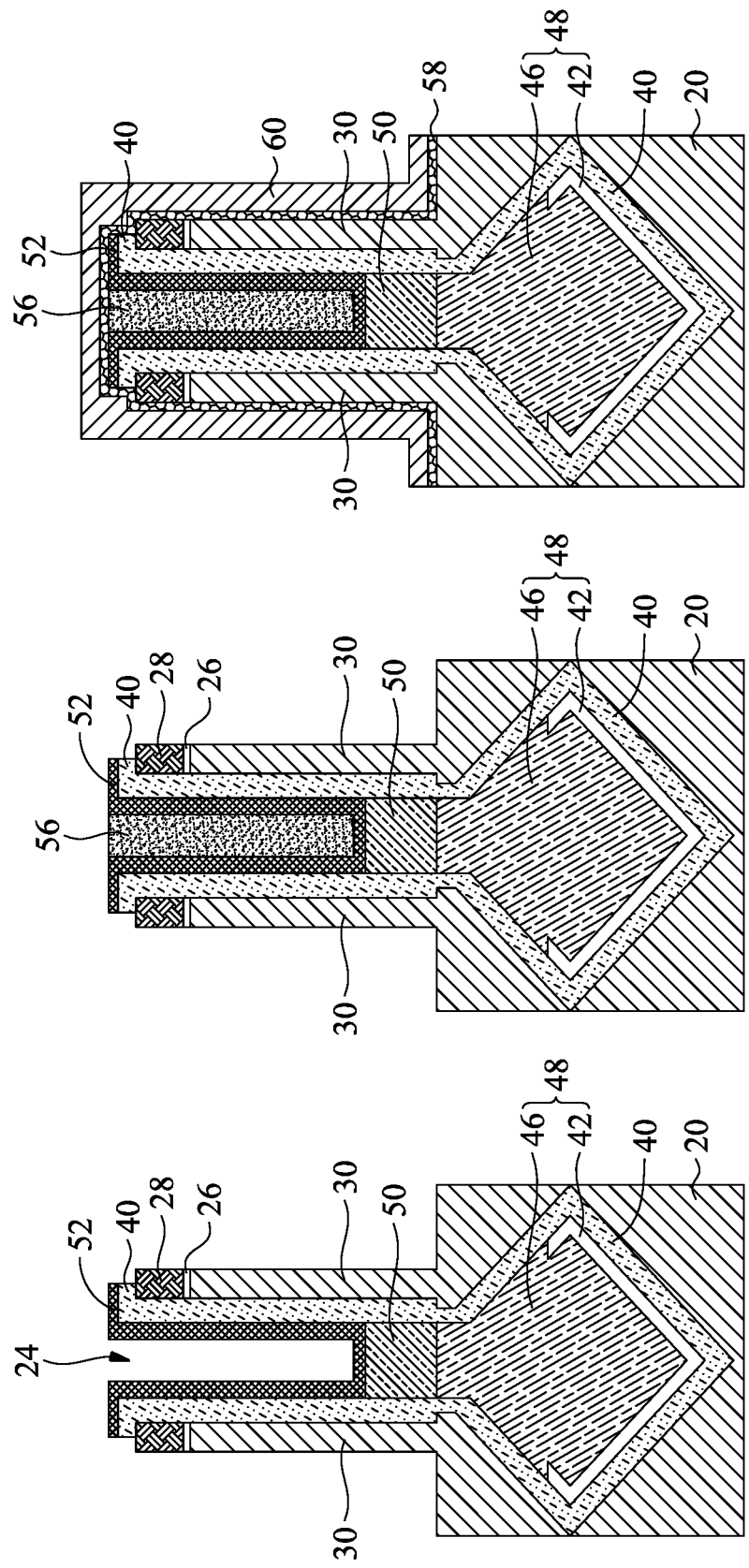

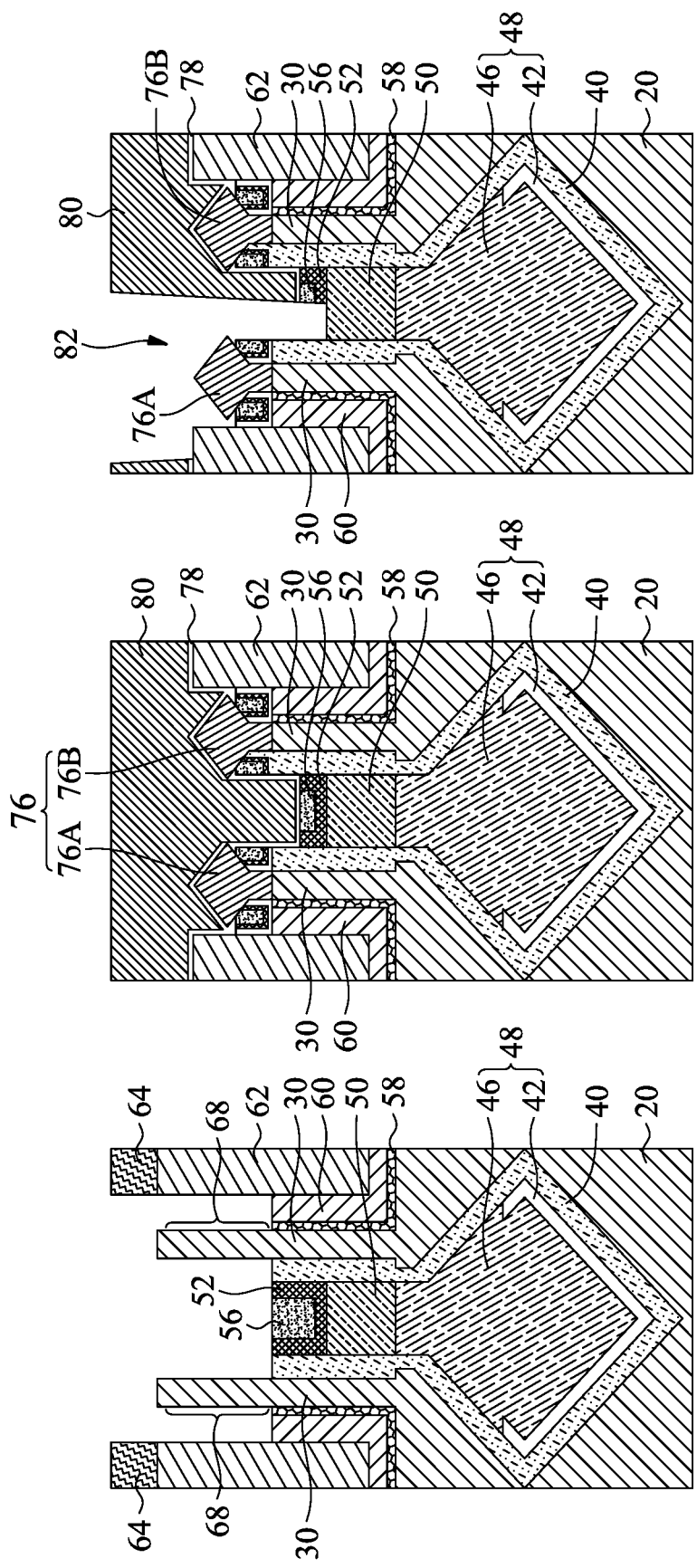

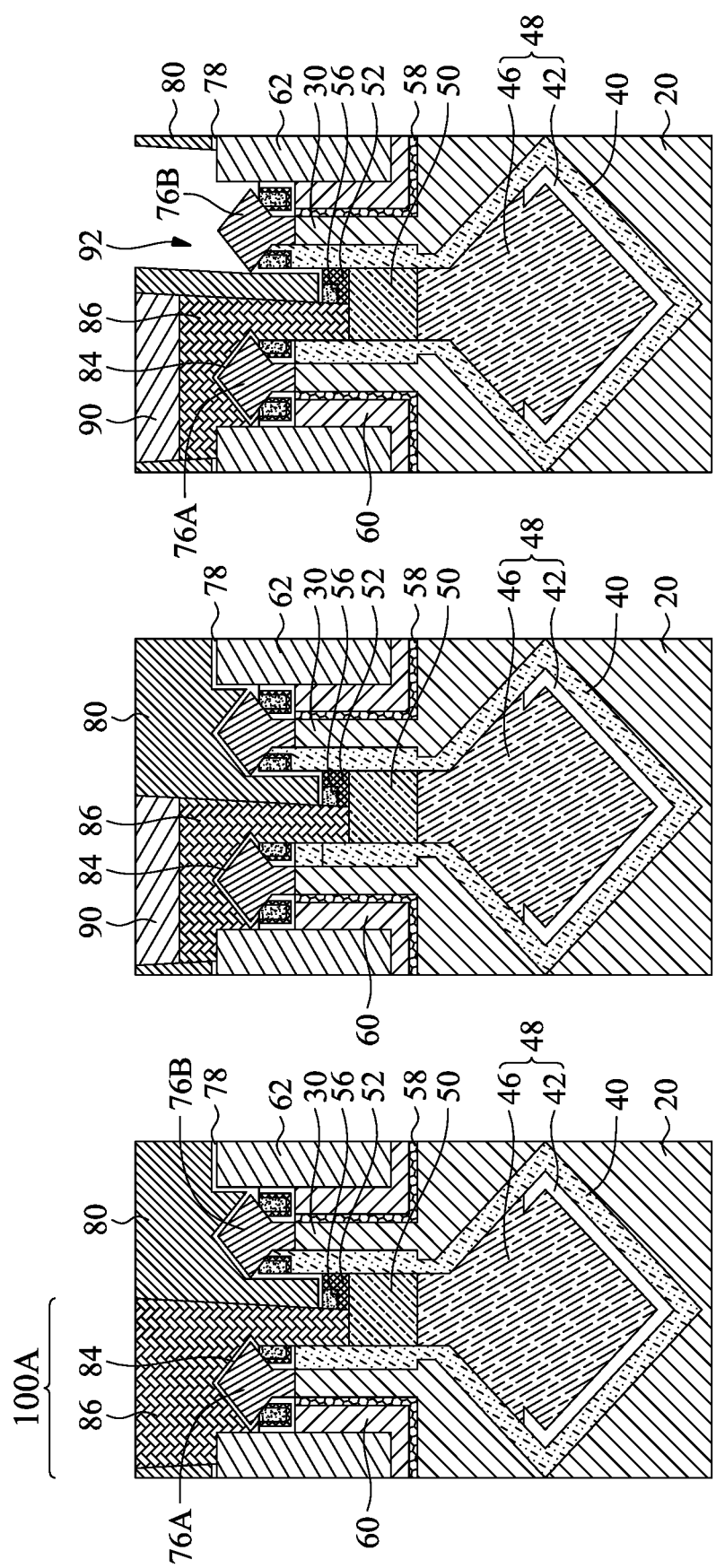

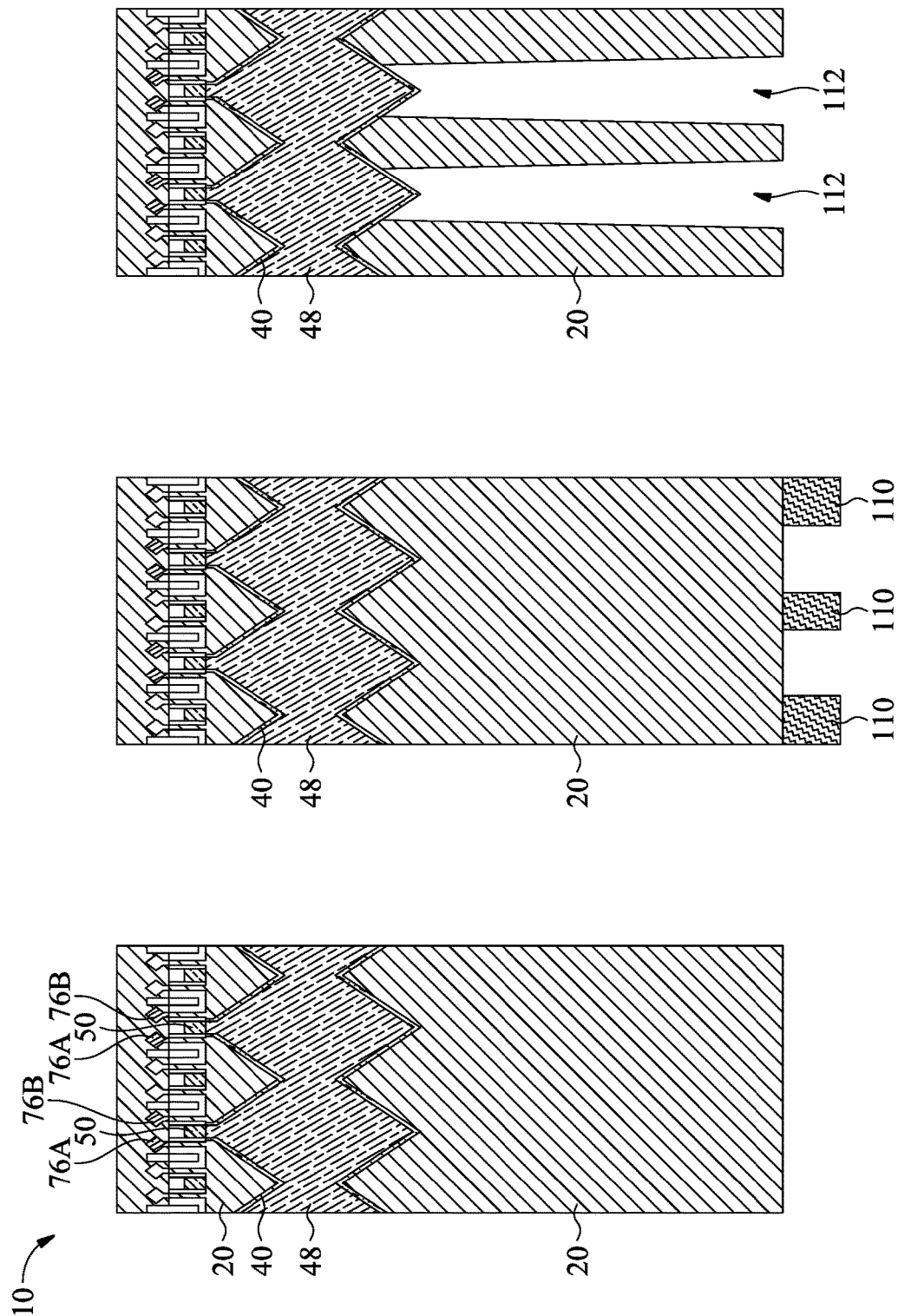

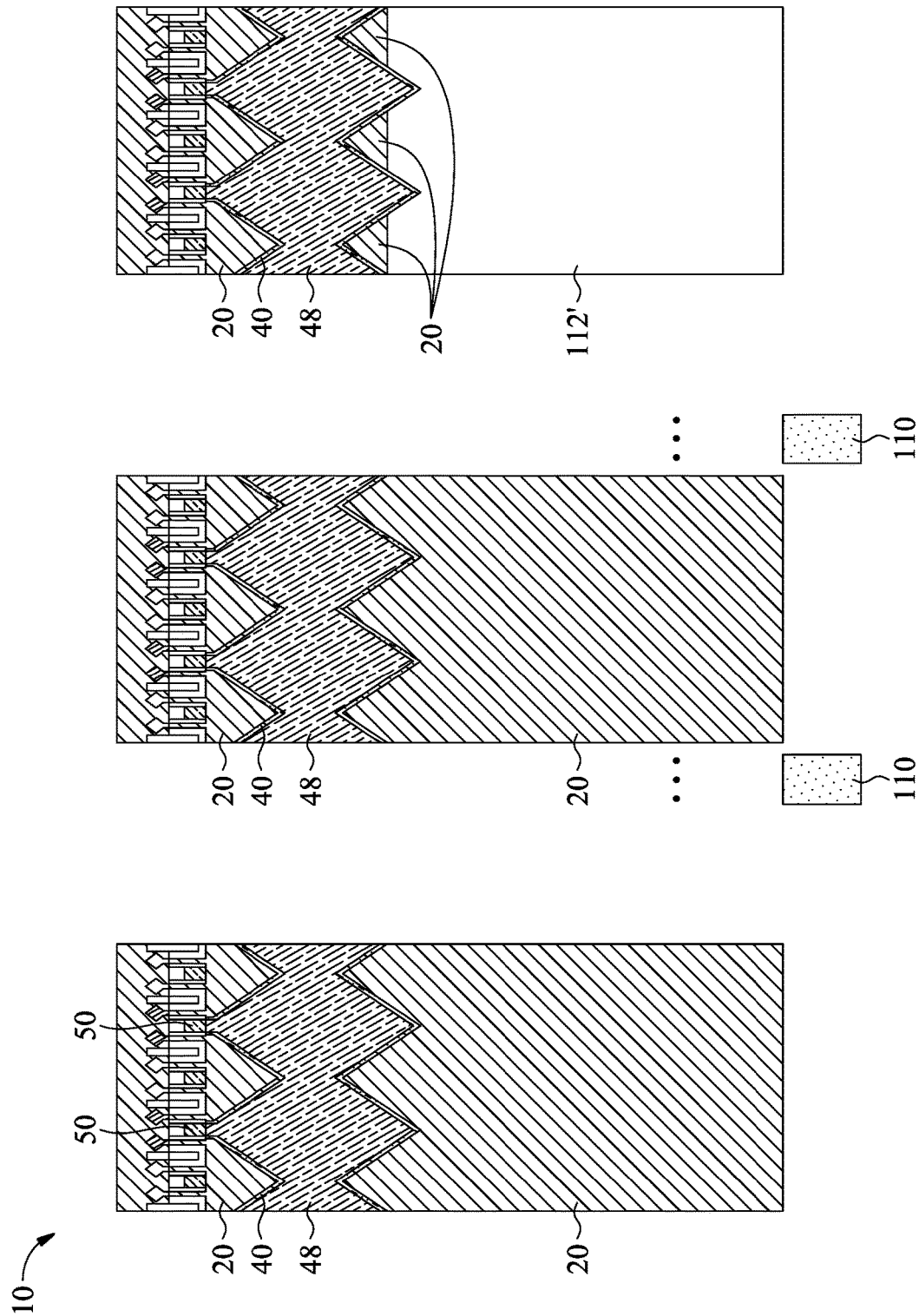

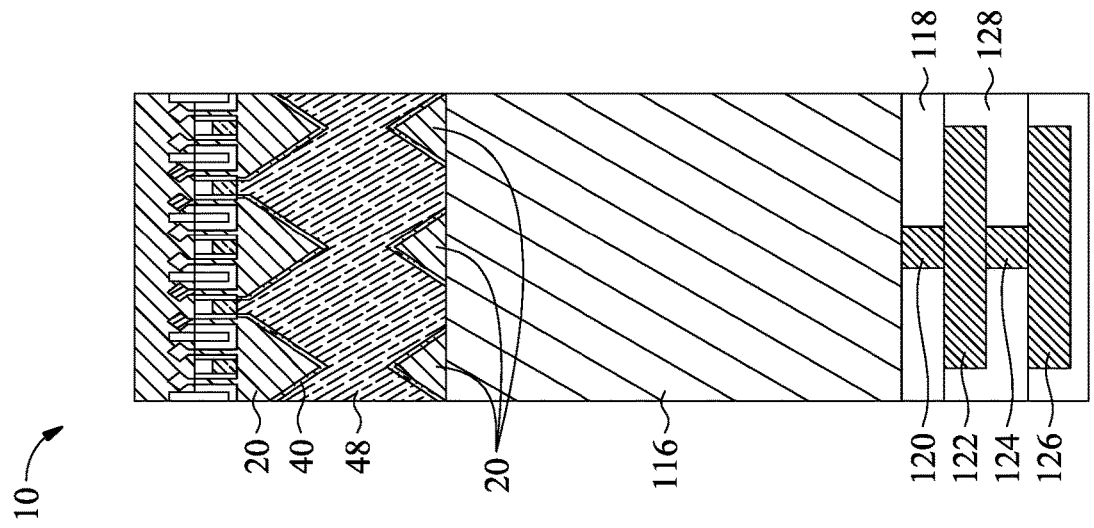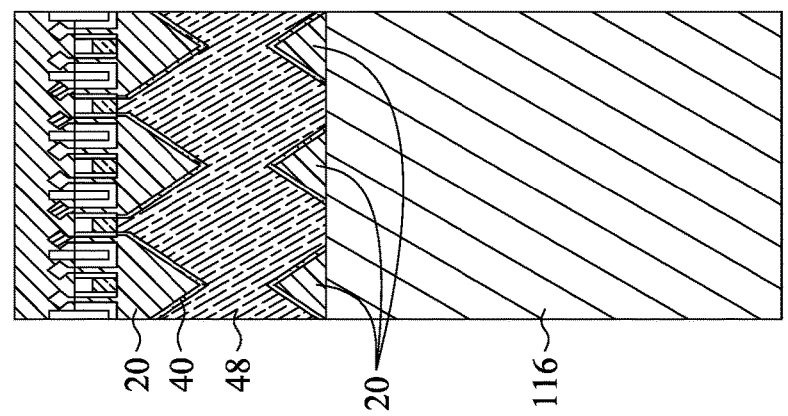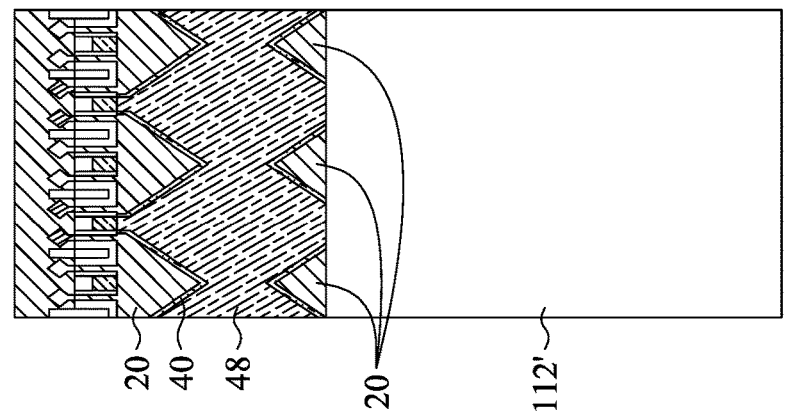

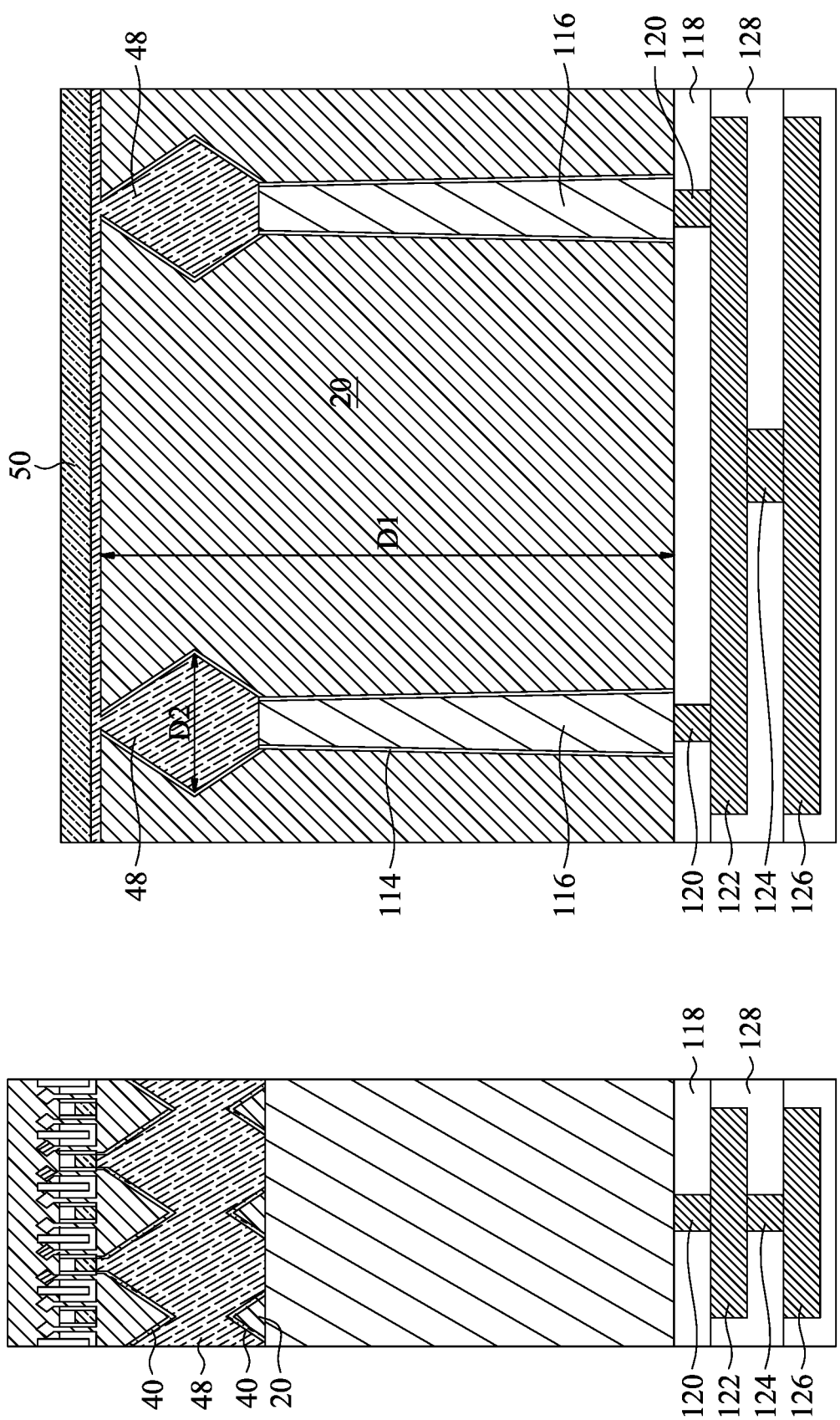

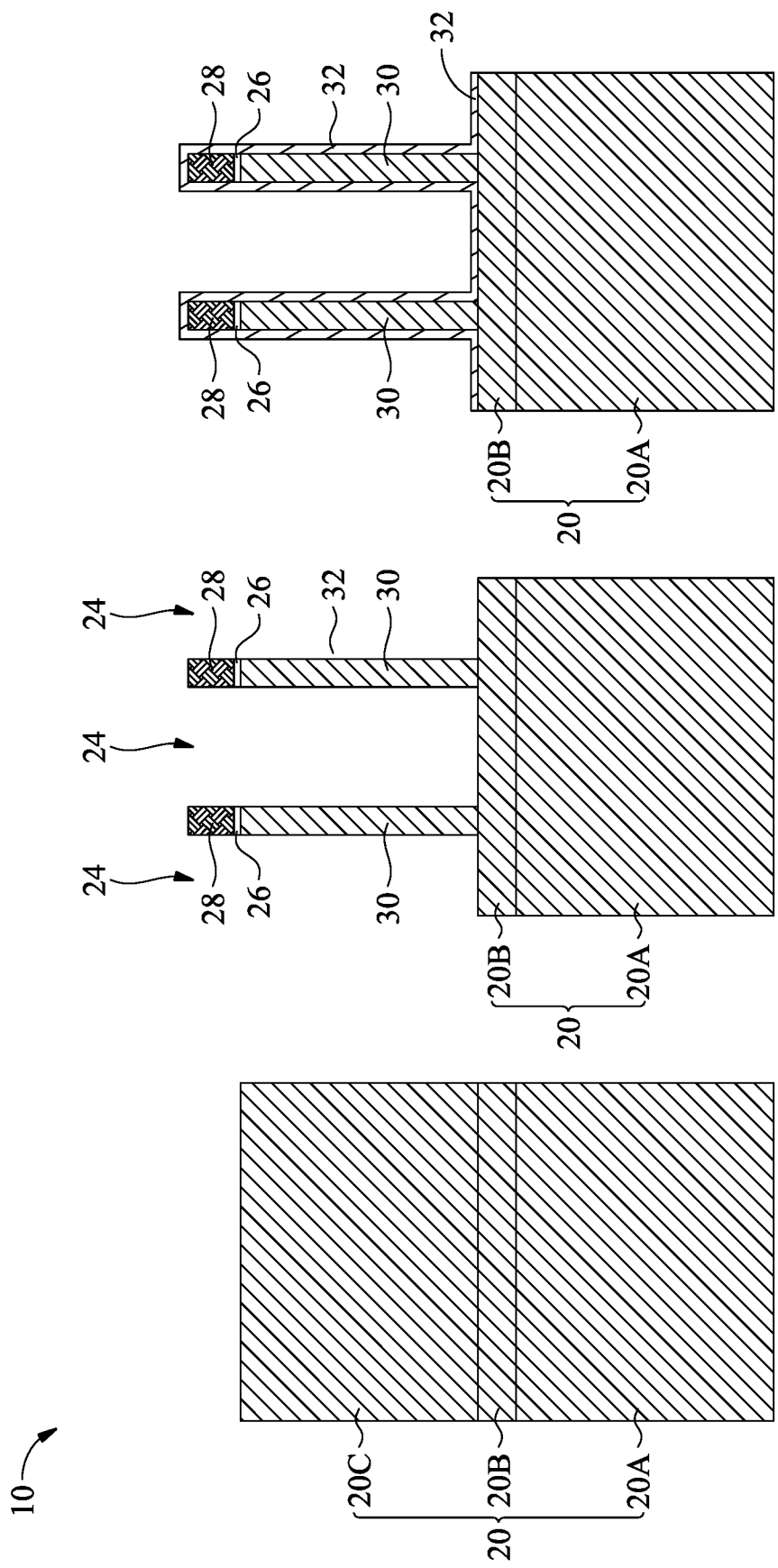

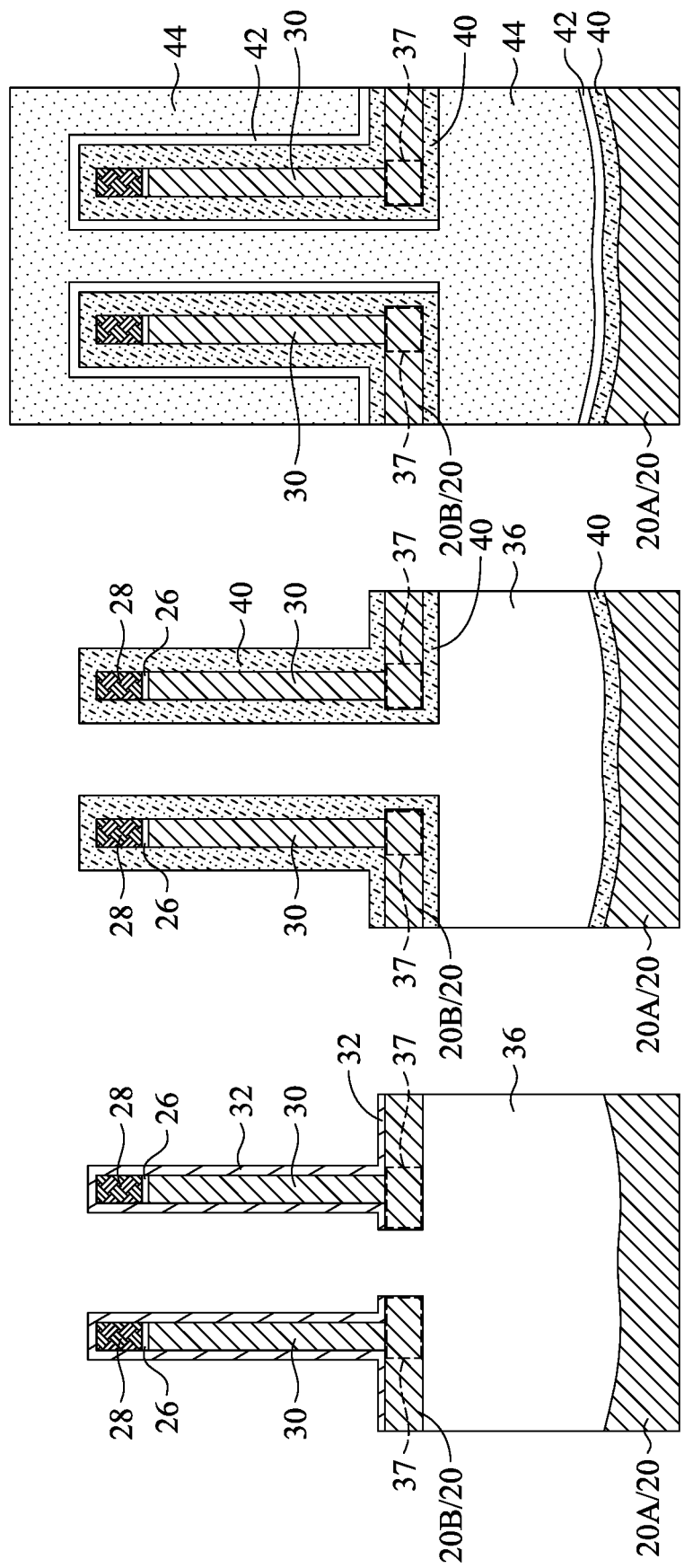

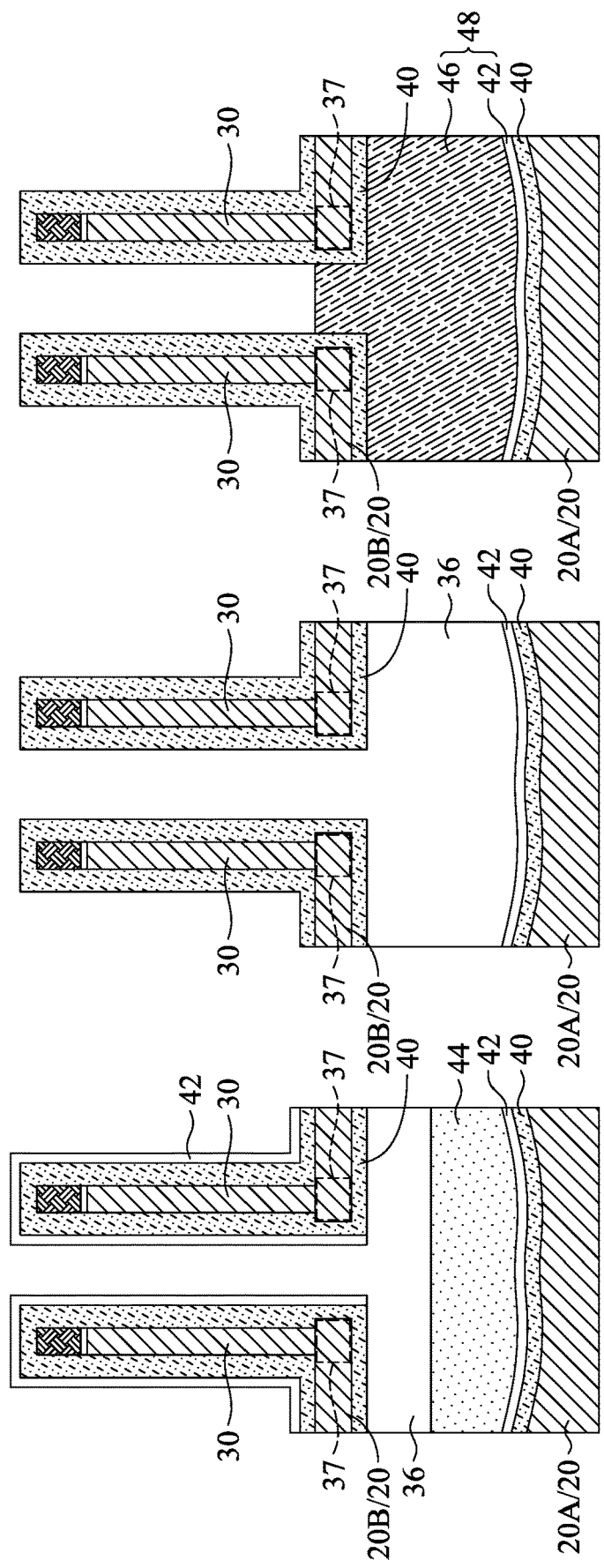

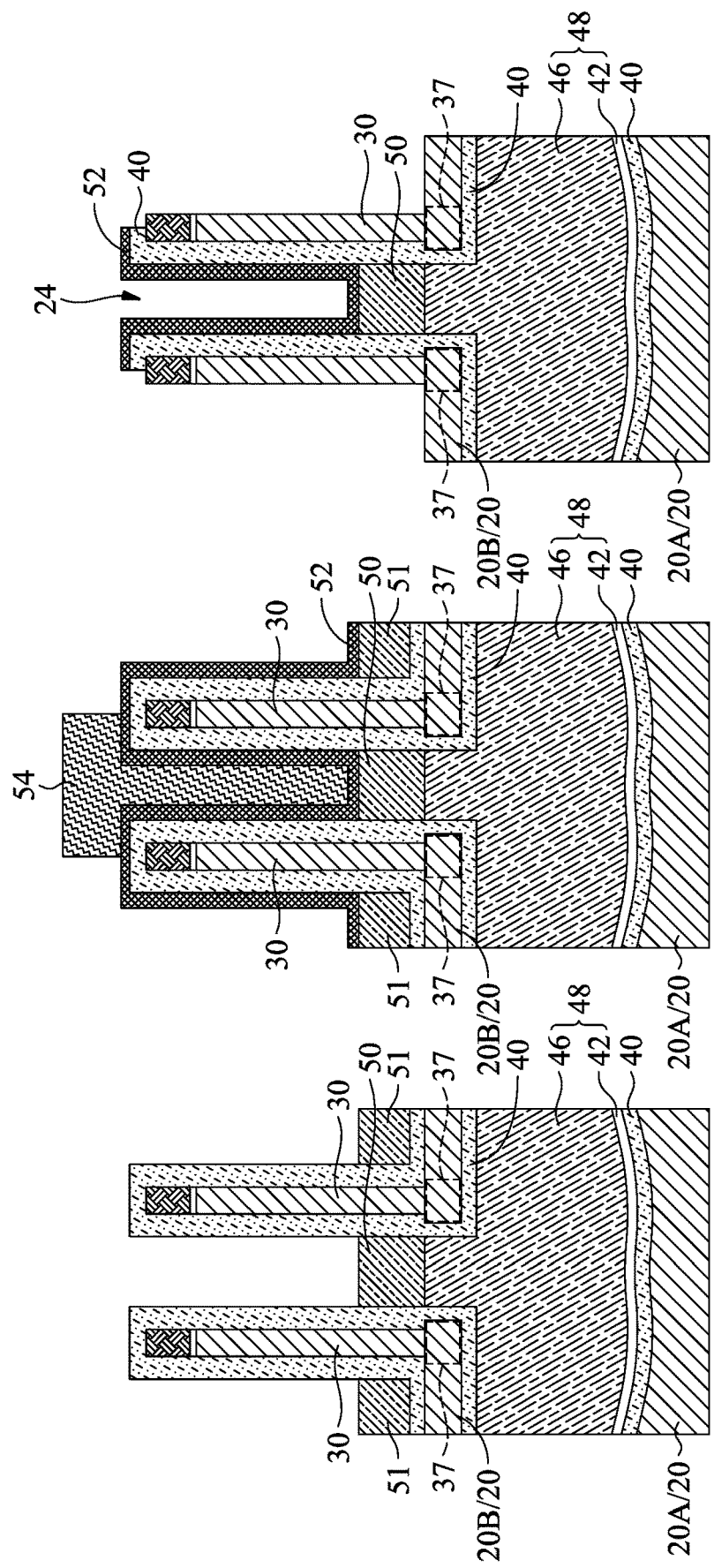

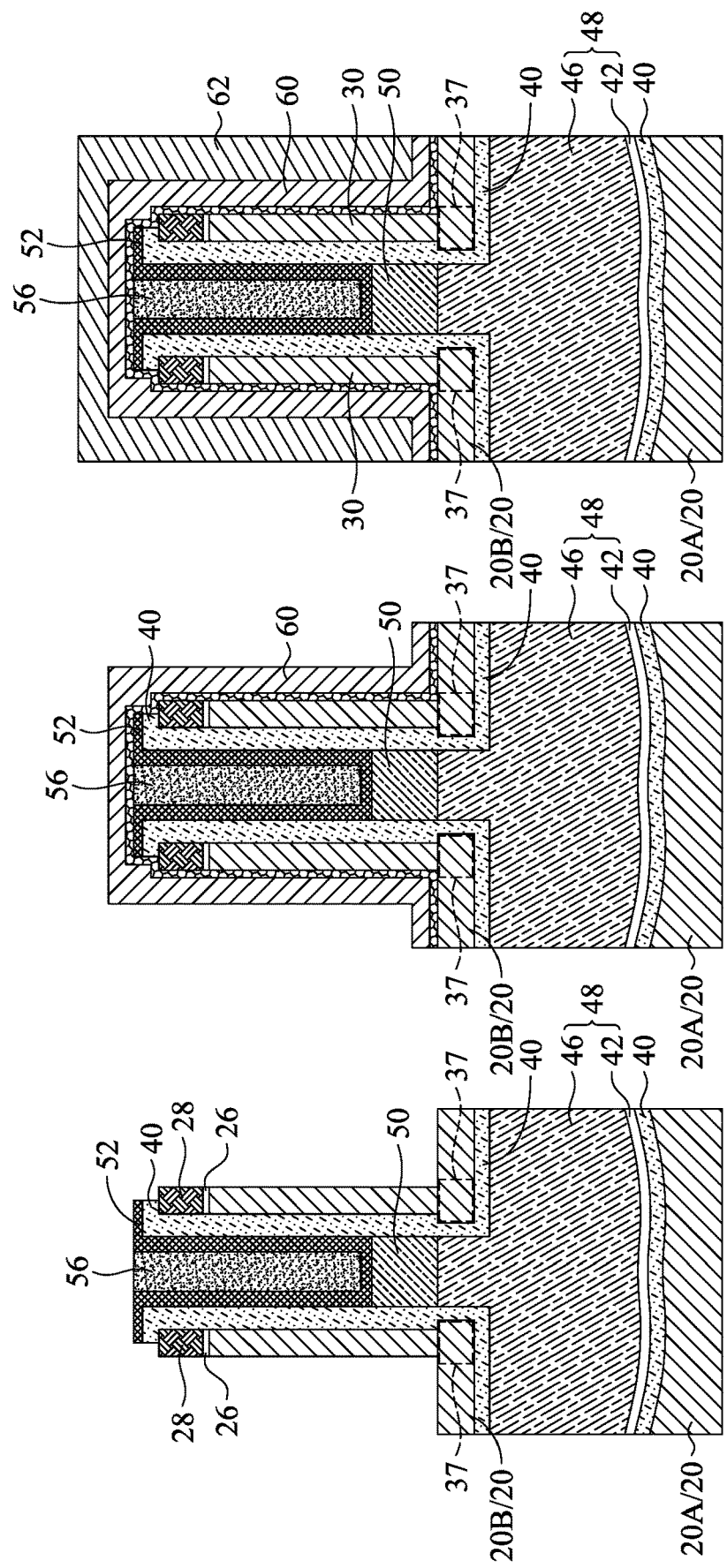

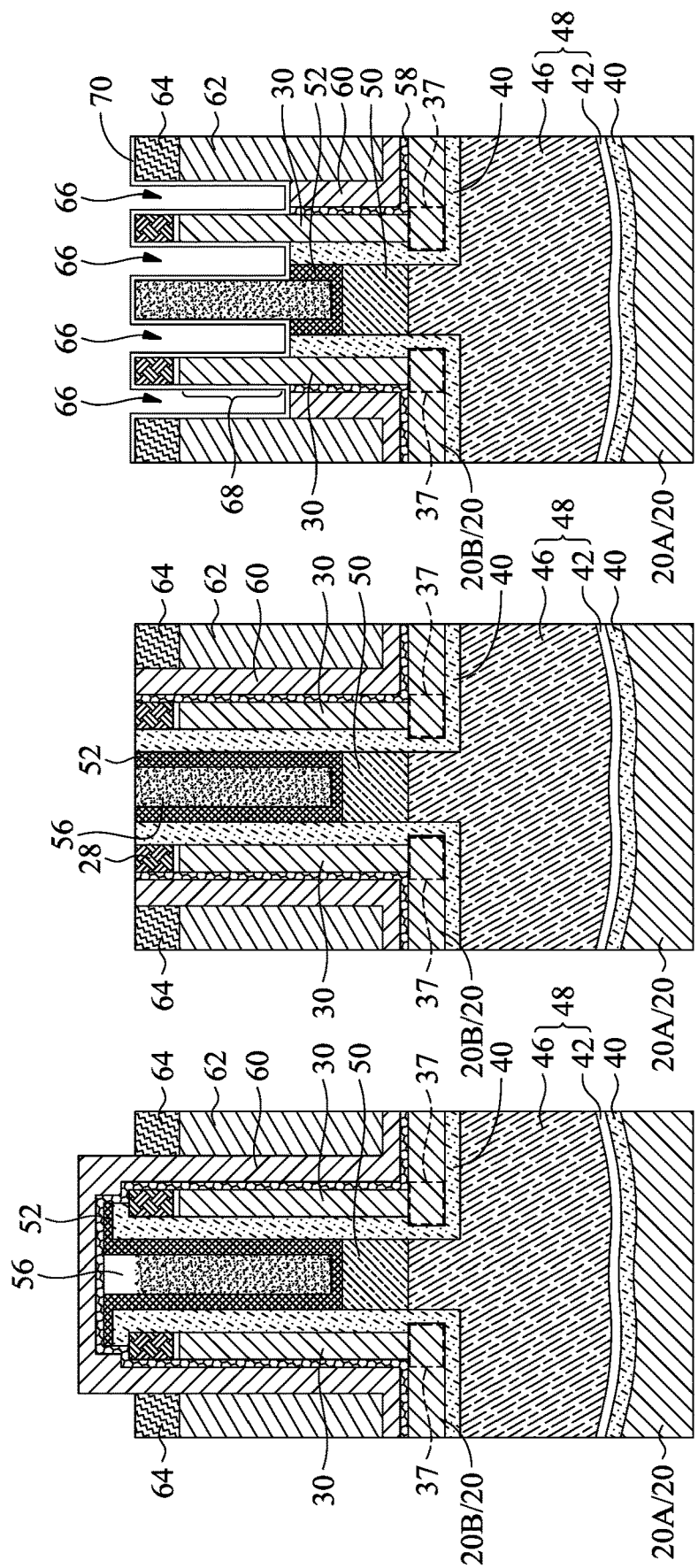

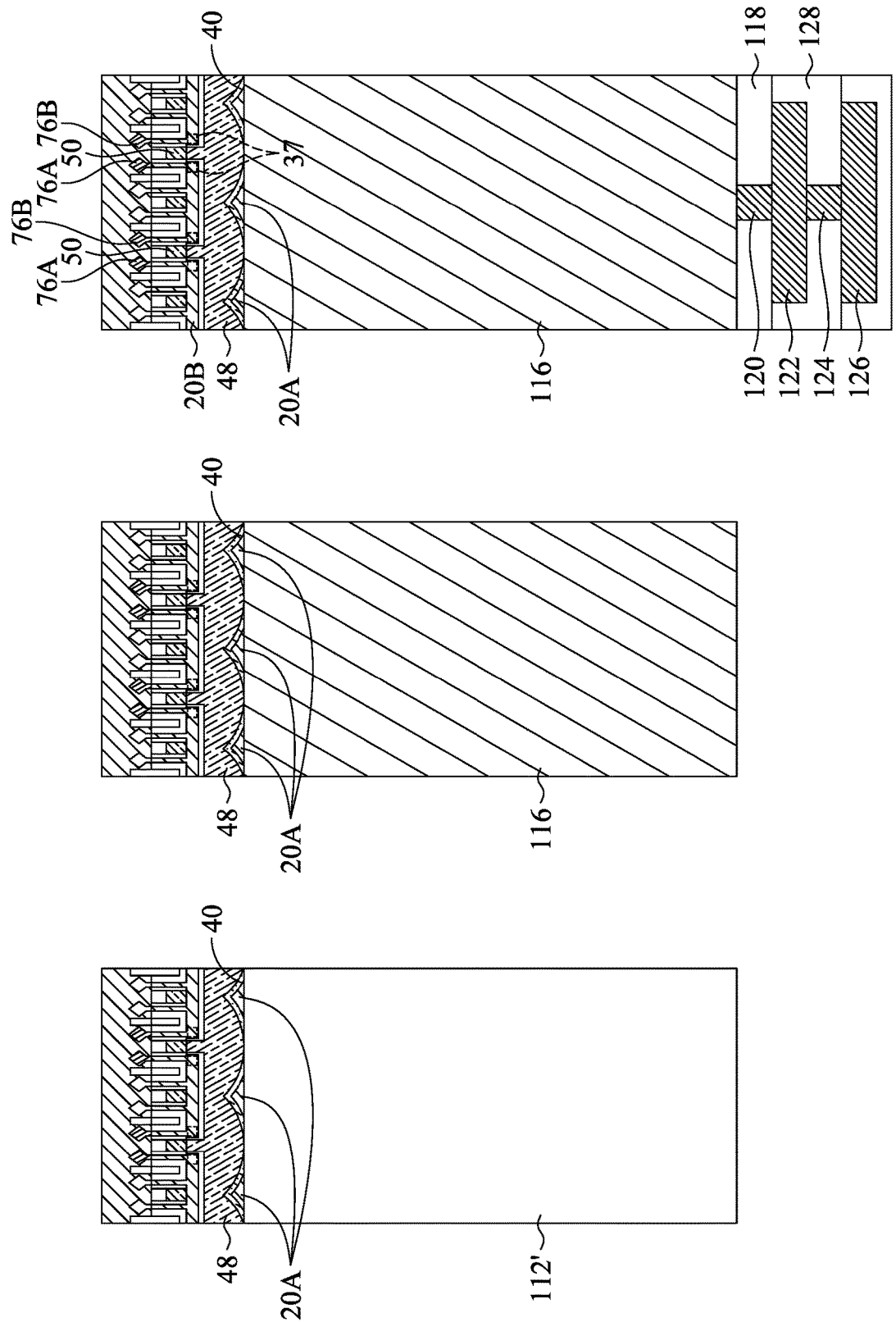

US 10,872,818 B2

BURIED POWER RAIL AND METHOD FORMING SAME

PRIORITY CLAIM AND CROSS-REFERENCE

This application claims the benefit of the following provisionally filed U.S. Patent application: Application Ser. No. 62/750,944, filed Oct. 26, 2018, and entitled "Buried Power Rail and Method Forming Same," which application is hereby incorporated herein by reference.

BACKGROUND

Modern integrated circuits are made up of transistors, capacitors, and other devices that are formed on semiconductor substrates. On a substrate, these devices are initially isolated from one another but are later interconnected together to form functional circuits. Typical interconnect structures include lateral interconnections, such as metal lines (wirings), and vertical interconnects, such as vias and contacts.

Power is provided to the integrated circuits through power rails, which are in the metal layers of integrated circuits. For example, the bottom metal layer (M0 or M1) may include a plurality of metal lines such as VDD power rails and VSS power rails.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1-16, 17A, 17B, and 18-24 illustrate the cross-sectional views of intermediate stages in the formation of buried power rails and diamond-shaped buried contacts in accordance with some embodiments.

FIG. 25 through 30 illustrate the cross-sectional views of intermediate stages in the formation of via-type through-vias in accordance with some embodiments.

FIG. 31 through 36 illustrate the cross-sectional views of intermediate stages in the formation of trench-type through-vias in accordance with some embodiments.

FIGS. 42 and 43 illustrate the cross-sectional views of the structure shown in FIG. 41 in accordance with some embodiments.

FIGS. 44-63, 64A, 64B, and 65-67 illustrate the cross-sectional views of intermediate stages in the formation of buried power rails and round buried contacts in accordance with some embodiments.

FIG. 68 through 73 illustrate the cross-sectional views of intermediate stages in the formation of a trench-type through-via in accordance with some embodiments.

DETAILED DESCRIPTION

Figures 4, 5, 6:
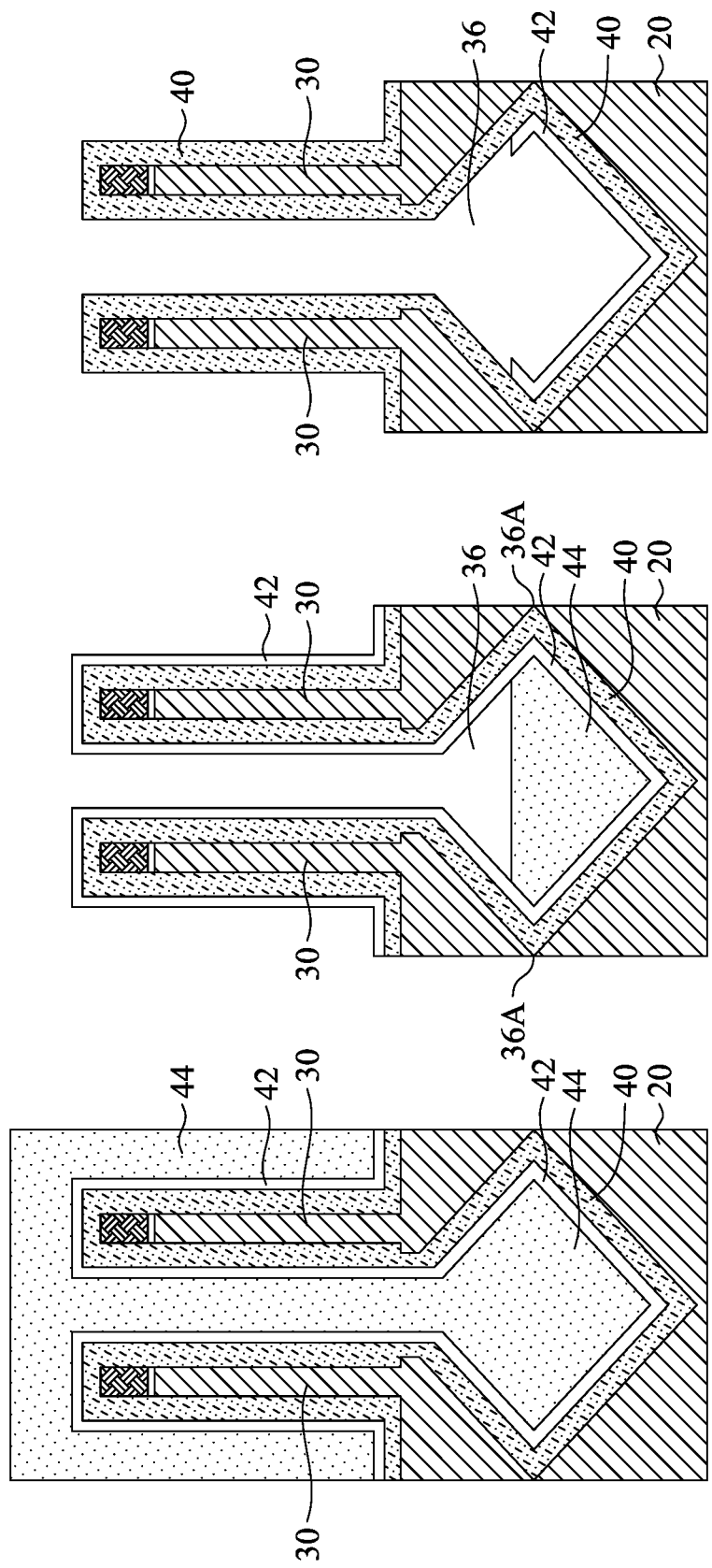

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Buried power rails, buried contacts, and the methods of forming the same are provided in accordance with various embodiments. The intermediate stages in the formation of the buried power rails and buried contacts are illustrated in accordance with some embodiments. Some variations of some embodiments are discussed. Throughout the various views and illustrative embodiments, like reference numbers are used to designate like elements. In accordance with some embodiments of the present disclosure, the buried power rails are formed in a semiconductor substrate, and the buried contacts are also formed in the semiconductor substrate to have increased widths than the buried power rails, so that through-vias in the semiconductor substrate may land on the buried contacts without misalignment.

FIGS. 1-16, 17A, 17B, and 18-24 illustrate the cross-sectional views of intermediate stages in the formation of buried power rails and diamond-shaped buried contacts in accordance with some embodiments of the present disclosure. The corresponding processes are also reflected schematically in the process flow shown in FIG. 77.

FIG. 1 illustrates a cross-sectional view of an initial structure. The initial structure includes wafer 10, which further includes semiconductor substrate 20. Semiconductor substrate 20 may be a silicon substrate, a silicon germanium substrate, or a substrate formed of other semiconductor materials such as III-V compound semiconductor materials. Semiconductor substrate 20 may be doped with a p-type or an n-type impurity. Semiconductor substrate 20 may have a (100) or a (001) surface plane.

Figure 77:
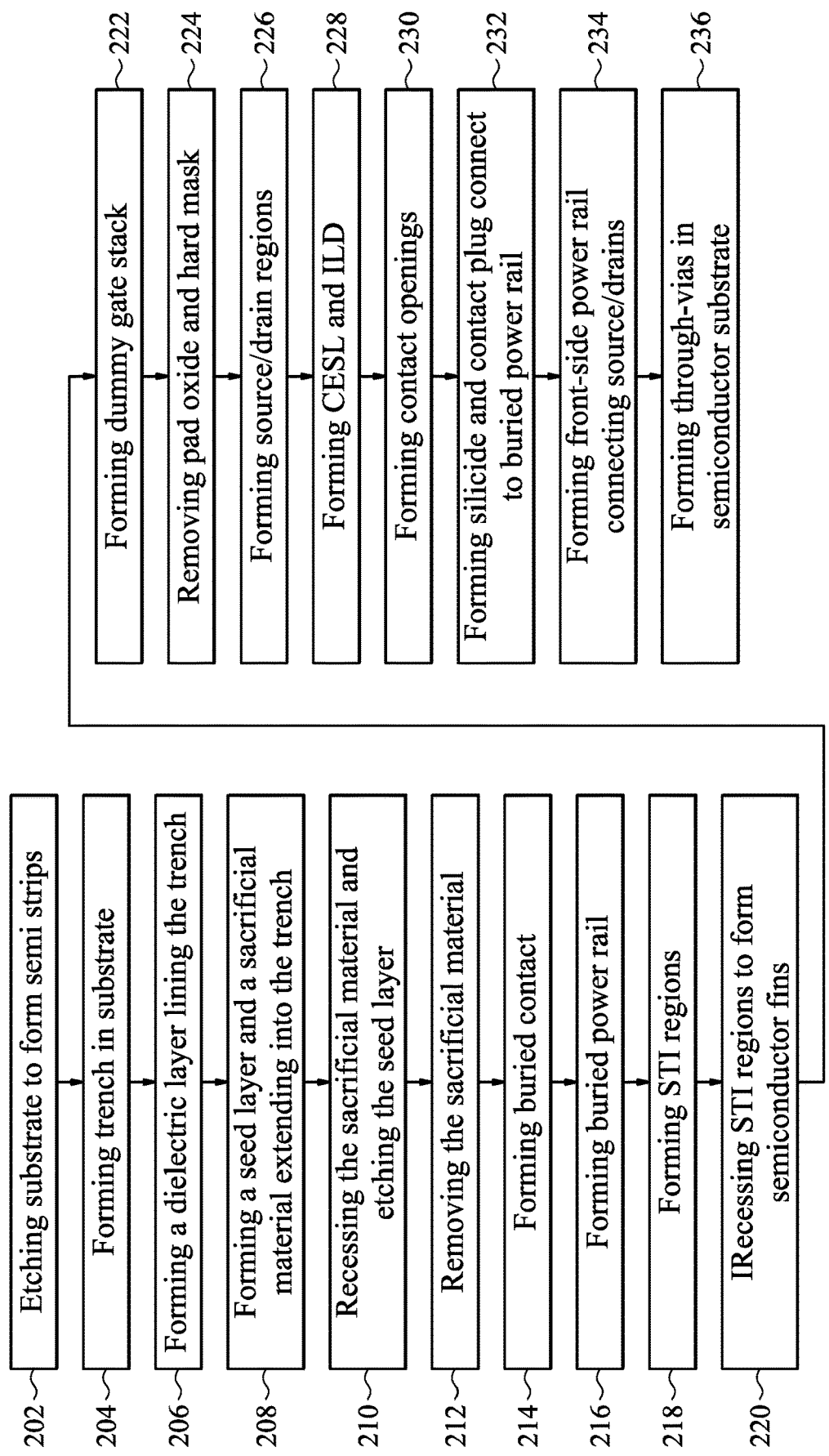
FIG. 77 illustrates a process flow for forming buried power rails and buried contacts in accordance with some embodiments.

Semiconductor substrate 20 is etched to form semiconductor strips 30. The respective process is illustrated as process 202 in the process flow 200 as shown in FIG. 77. To etch semiconductor substrate 20, pad oxide layer 26 and hard mask layer 28 are formed on semiconductor substrate 20, and are then patterned. Pad oxide layer 26 may be a thin film formed of silicon oxide. In accordance with some embodiments of the present disclosure, pad oxide layer 26 is formed in a thermal oxidation process, wherein a top surface layer of semiconductor substrate 20 is oxidized to form pad oxide layer 26. Pad oxide layer 26 acts as an adhesion layer between semiconductor substrate 20 and hard mask layer 28. Pad oxide layer 26 may also act as an etch stop layer for etching hard mask layer 28. In accordance with some embodiments of the present disclosure, hard mask layer 28 is formed of silicon nitride, for example, using Low-Pressure Chemical Vapor Deposition (LPCVD). In accordance with other embodiments of the present disclosure, hard mask layer 28 is formed through thermal nitridation of silicon, or Plasma Enhanced Chemical Vapor Deposition (PECVD). A photo resist (not shown) is formed on hard mask layer 28 and is then patterned. Hard mask layer 28 is then etched using the patterned photo resist as an etching mask to form patterned hard mask layer 28 as shown in FIG. 2.

Next, the patterned hard mask layer 28 is used as an etching mask to etch pad oxide layer 26 and substrate 20, forming trenches 24. The portions of semiconductor substrate 20 between trenches 24 are semiconductor strips 30, which may have the shape of elongated strips when viewed from top. Semiconductor strips 30 are over and contacting a bulk portion of semiconductor substrate 20, which are also referred to as bulk semiconductor substrate 20. Next, dielectric layer 32 is formed, which may be a conformal layer formed on the sidewalls and tops surfaces of the structure formed in preceding processes. Dielectric layer 32 may be deposited using, for example, Atomic Layer Deposition (ALD), Chemical Vapor Deposition (CVD), or the like, so that dielectric layer 32 is formed as a conformal layer.

Next, referring to FIG. 2, etching mask 34 (which may be formed of photo resist) is formed and patterned, so that the space between two neighboring semiconductor strips 30 is exposed. The portions of dielectric layer 32 are first removed, for example, in an anisotropic etching process, so that the top surface of the underlying semiconductor substrate 20 is exposed. Next, bulk semiconductor substrate 20 is etched to form trench 36, which may have a diamond shape. The respective process is illustrated as process 204 in the process flow 200 as shown in FIG. 77. The diamond shape extends lower than the bottoms of semiconductor strips 30, and extends into the bulk portion of semiconductor substrate 20. In accordance with some embodiments of the present disclosure, the etching includes an anisotropic etching process (a dry etching process) followed by an isotropic etching process such as a wet etching process or a dry etching process. For example, in the anisotropic etching process, the trench 36 is first formed to extend to the position marked by dashed lines 38, and then the isotropic etching process is performed. The dry isotropic etching process may be performed using $C_2F_6$, $CF_4$, $SO_2$, the mixture of HBr, $Cl_2$ and $O_2$, or the mixture of HBr, $Cl_2$, $O_2$ and $CF_2$ etc. The wet isotropic etching process may be performed using KOH, tetramethylammonium hydroxide (TMAH), $CH_3COOH$, $NH_4OH$, $H_2O_2$, Isopropanol (IPA), or the solution of HF, $HNO_3$, and $H_2O$.

The anisotropic etch extends trench 36 down into bulk semiconductor substrate 20, so that in the subsequent isotropic etching process, trench 36 does not encroach into semiconductor strips 30. As a result of the isotropic etching process, the surfaces of semiconductor substrate 20 facing trenches 36 are on (111) surface planes. Trench 36 expands horizontally to have a horizontal dimension greater than the distance between neighboring semiconductor strips 30. Furthermore, trench 36 is self-aligned to the space between semiconductor strips 30. Also, referring to FIGS. 38 and 41, the positions of the centers of trenches 36 (which are filled to form buried contacts 48) will be aligned to straight lines (extending in the Y-direction), and the centers of trenches 36 are the centers of diamonds in FIG. 38 or 41. Etching mask 34 (FIG. 2) may be removed either after the anisotropic etching process (but before the isotropic etching process), or after the isotropic etching process.

Dielectric layer 32 is then removed, for example, in an isotropic etching process. Next, dielectric layer 40 (which is a liner layer) is formed protecting the sidewalls of semiconductor strips 30, as shown in FIG. 3. The respective process is illustrated as process 206 in the process flow 200 as shown in FIG. 77. Dielectric layer 40 is conformal, and forms a liner protecting the exposed surfaces (including (111) surfaces) of semiconductor substrate 20 facing trench 36. Dielectric layer 40 is formed using a conformal deposition method such as ALD, CVD, or the like. Dielectric layer 40 may be formed of silicon oxide, silicon nitride, or the like.

FIG. 4 illustrates the formation of conductive seed layer 42, which may be formed of a metal-containing conductive material such as TiN, TaN, or the like. The respective process is illustrated as process 208 in the process flow 200 as shown in FIG. 77. The formation method may include a conformal deposition method such as ALD, CVD, or the like. Next, a sacrificial material 44 is dispensed to fill trench 36. The respective process is also illustrated as process 208 in the process flow 200 as shown in FIG. 77. Sacrificial material 44 may be formed of photo resist, a polymer, or another type of material that can fill trench 36. The formation method may include spin-on coating, while other bottom-up deposition methods may also be used providing it may at least substantially fully fill trench 36. If sacrificial material 44 is formed using deposition, a planarization process such as a Chemical Mechanical Polish (CMP) process or a mechanical grinding process may be performed to level the top surface of sacrificial material 44.

Next, as shown in FIG. 5, sacrificial material 44 is etched back, until the top surface of the remaining sacrificial material 44 is lower than the bottom ends of semiconductor strips 30. The respective process is illustrated as process 210 in the process flow 200 as shown in FIG. 77. The top surface of remaining sacrificial material 44 may be close to, and may be higher than, level with, or lower than the side tips 36A of trench 36. The top surface level of remaining sacrificial material 44 is selected so that the subsequently formed buried contact 48 (FIG. 7) may fully fill trench 36 with small or no void therein. Conductive seed layer 42 is then etched, for example, in an isotropic etching process, so that the upper portions of conductive seed layer 42 higher than the top surface of remaining sacrificial material 44 are etched, while the bottom portions of conductive seed layer 42 are protected by sacrificial material 44. The respective process is also illustrated as process 210 in the process flow 200 as shown in FIG. 77. After the etching process, sacrificial material 44 is removed, resulting in the structure as shown in FIG. 6. The respective process is illustrated as process 212 in the process flow 200 as shown in FIG. 77.

FIG. 7 illustrates the deposition of conductive material 46. The respective process is illustrated as process 214 in the process flow 200 as shown in FIG. 77. The deposition process may include plating, for example. The top surface of conductive material 46 may be higher than the bottoms of semiconductor strips 30. Alternatively, the top surface of conductive material 46 may be level with the bottoms of semiconductor strips 30. Throughout the description, conductive material 46 and the remaining conductive seed layer 42 are collectively referred to as buried contact(s) 48, which are buried diamond-shaped contacts in accordance with some embodiments.

Figure 38:
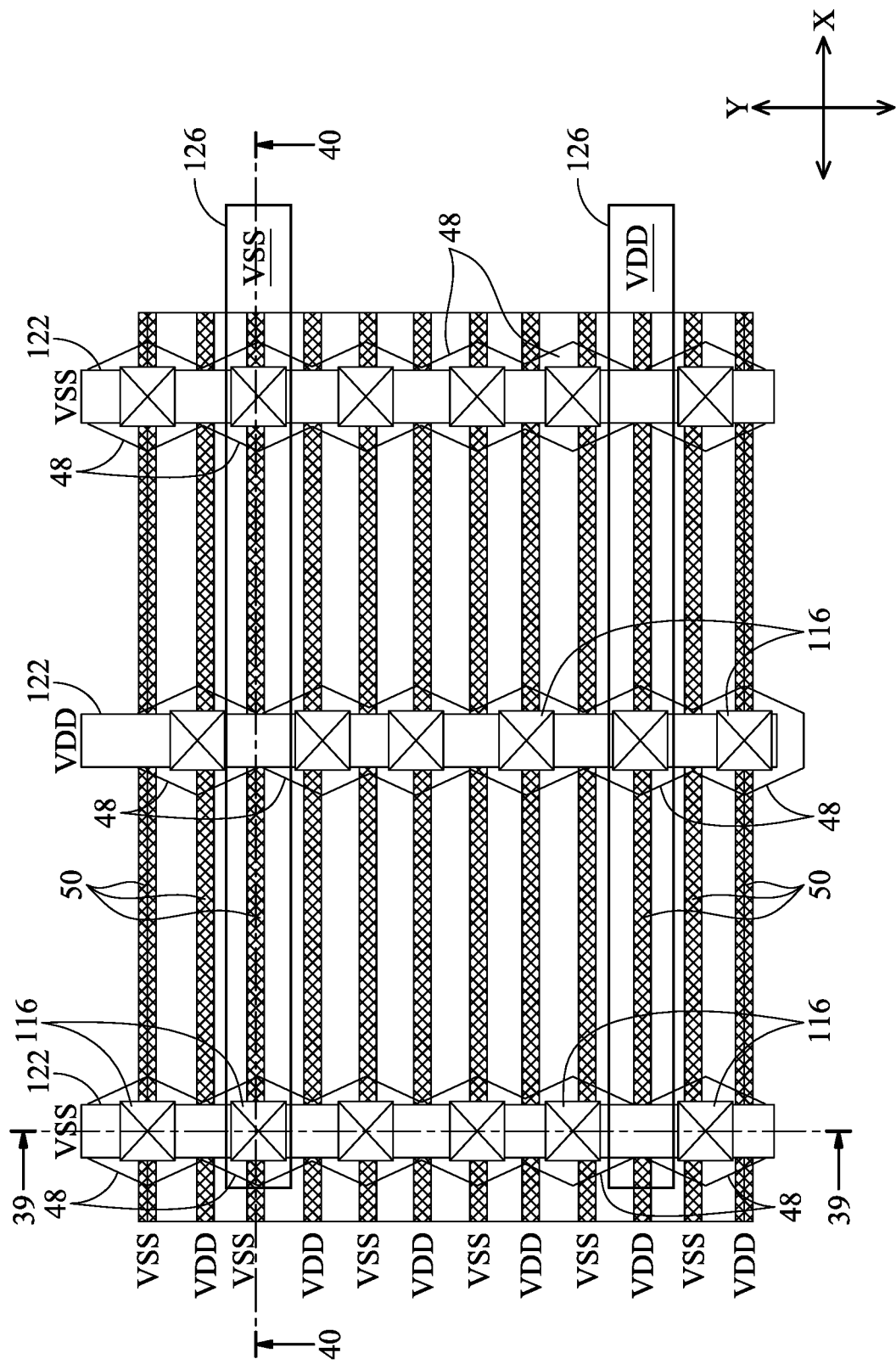
FIG. 38 illustrates a bottom view of buried power rails and buried contacts in accordance with some embodiments.
Figure 41:
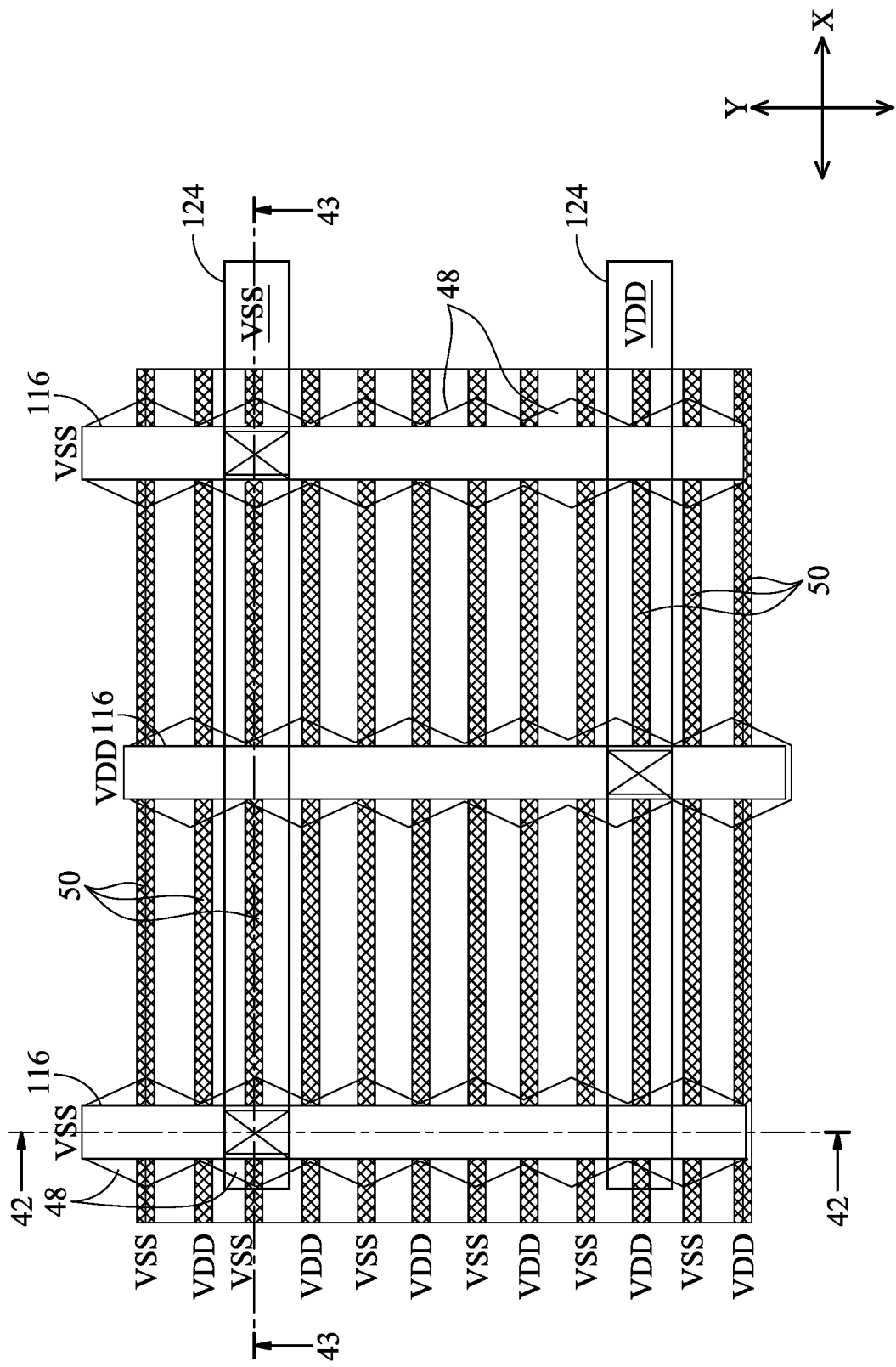
FIG. 41 illustrates a bottom view of buried power rails and buried contacts in accordance with some embodiments.

Referring back to FIG. 7, although a single buried contact 48 is illustrated, there may be a buried contact 48 on the left of, and joining to, the illustrated buried contact 48, and a buried contact 48 on the right side of, and joining to, the illustrated buried contact 48. The joining of neighboring buried contacts 48 are shown in FIGS. 25 and 31. FIGS. 38 and 41 illustrate the top views of a plurality of buried contacts 48, which are aligned to a plurality of straight lines extending in the Y-direction. The top portions 48A (FIG. 7) of the plurality of buried contact 48 (FIGS. 38 and 41) aligned to the same straight line are separated from each other, while the middle portions 48B (FIG. 7) of the plurality of buried contact 48 (FIGS. 38 and 41) aligned to the same straight line are interconnected to form an elongated buried contact, as shown in FIGS. 38 and 41.

FIG. 8 illustrates the formation of buried power rail 50. The respective process is illustrated as process 216 in the process flow 200 as shown in FIG. 77. The formation process may include depositing a conductive material such as tungsten, cobalt, or the like, for example, using CVD, performing a planarization process to level the top surface of the deposited conductive material, and etching back the conductive material. The remaining portions of the conductive material include buried power rail 50 and conductive strips 51. Buried power rail 50 is located at the same level as some portions of semiconductor strips 30.

Buried power rail 50 may be an elongated strip, and a plurality of buried power rails 50 may be formed to be parallel with each other, as shown in FIGS. 38 and 41 (the top views), in which the lengthwise directions of buried power rails 50 are in the X-direction. On the other hand, buried contacts 48, when viewed from top, may also have diamond shapes, as also shown in FIGS. 38 and 41. As shown in FIGS. 38 and 41, the lengthwise direction of buried power rails 50 is perpendicular to the lengthwise direction of the interconnected buried contacts 48.

Next, as shown in FIG. 9, dielectric layer 52 is formed, followed by the formation of etching mask 54. In accordance with some embodiments of the present disclosure, dielectric layer 52 is formed of silicon oxide, silicon nitride, silicon oxynitride, or the like. Etching mask 54 may be formed of photo resist or other like materials. Etching mask 54 is patterned to cover buried power rail 50, and extends directly over some portions of semiconductor strips 30. Dielectric layer 52 and dielectric layer 40 are then etched using etching mask 54 to define the pattern. Conductive strips 51 are also etched. The resulting structure is shown in FIG. 10.

FIGS. 11 through 15 illustrate the formation of isolation regions, which are sometimes referred to as Shallow Trench Isolation regions. The respective process is illustrated as process 218 in the process flow 200 as shown in FIG. 77. FIG. 11 illustrates the formation of filling region 56 to fill the remaining trench 24 (FIG. 10) between semiconductor strips 30. Filling region 56 may be formed of SiN, SiON, or the like, which is deposited. A patterning process is then performed to remove some portions of the deposited dielectric material not directly over buried power rail 50.

FIG. 12 illustrates the formation of dielectric layers 58 and 60, which are formed of dielectric materials different from each other. For example, dielectric layers 58 and 60 may be formed of silicon oxide and silicon nitride, respectively, and other dielectric materials may also be used. The formation method may include a conformal deposition method such as ALD or CVD.

Figure 13:
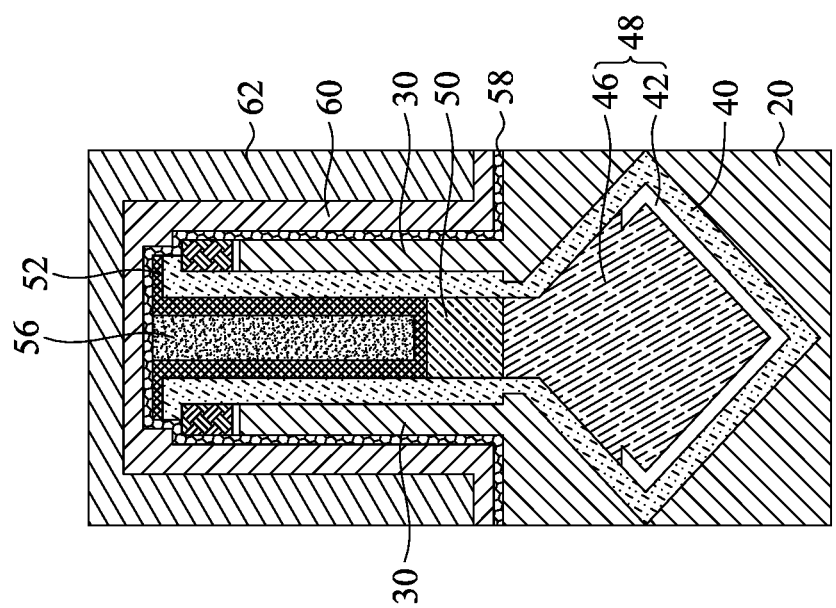

FIG. 13 illustrates the deposition of a dielectric material, forming dielectric region 62. In accordance with some embodiments of the present disclosure, dielectric region 62 is formed using Flowable CVD (FCVD), spin-on coating, Atomic Layer Deposition (ALD), High-Density Plasma Chemical Vapor Deposition (HDPCVD), Chemical Vapor Deposition (CVD), or the like. Dielectric region 62 may include a silicon-containing oxide or other types of dielectric materials. Dielectric region 62 may be formed of a low-k dielectric material, which has a dielectric constant lower than about 3.5 or lower than about 3.0.

Figure 14:
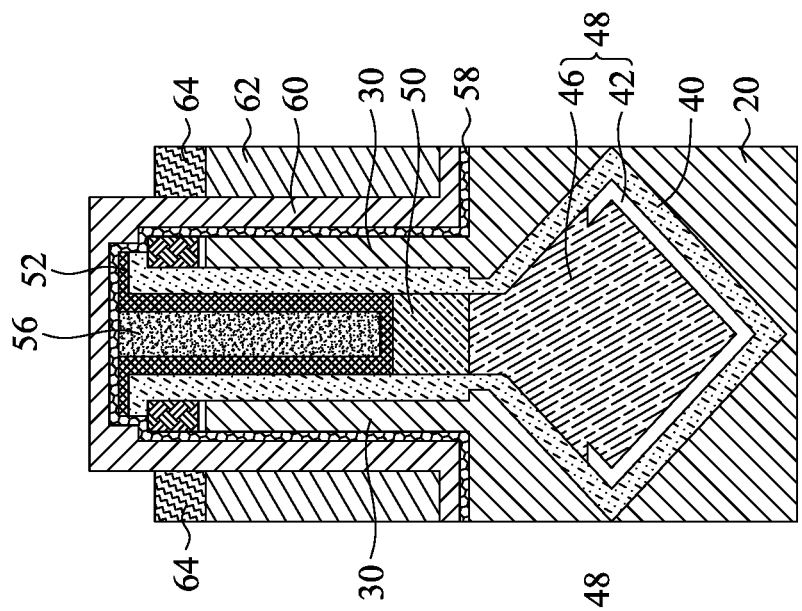

Referring to FIG. 14, dielectric region 62 is etched back, and dielectric layer 64 is deposited and then etched back. Dielectric layer 64 may be formed of a dielectric material different from the material of dielectric region 60, and may have a density higher than the density of dielectric region 62. For example, dielectric layer 64 may be formed of a high-k dielectric material such as a oxide or a silicate of Hf, Al, Zr, La, Mg, Ba, Ti, Pb, and combinations thereof.

Figure 15:
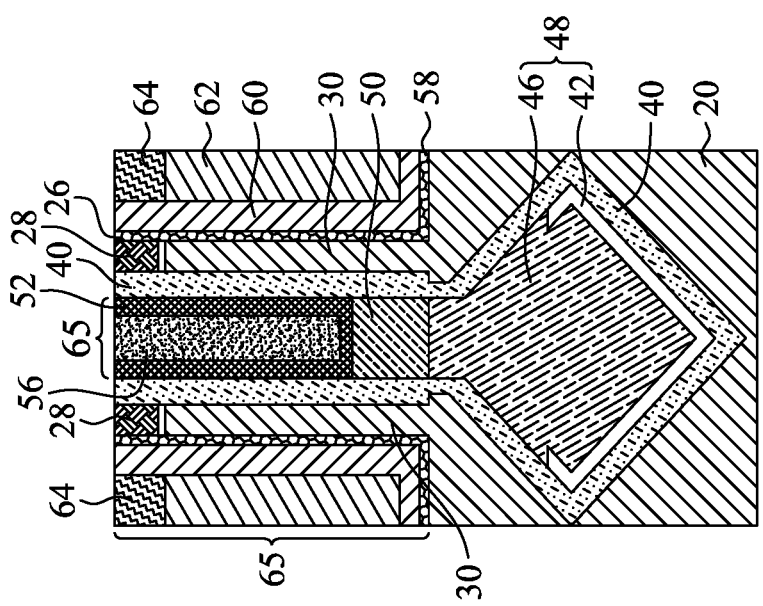

FIG. 15 illustrates the structure after a planarization process such as a CMP process or a mechanical grinding process. Dielectric layer 64 may be used as a CMP stop layer for the planarization process. The remaining portions of dielectric layers 58 and 60, and dielectric regions 62 and 64 are collectively referred to as STI regions 65. Also, the portions of dielectric layer 52 and filling region 56 between semiconductor strips 30 are also collectively referred to as STI region 65.

Figure 16:
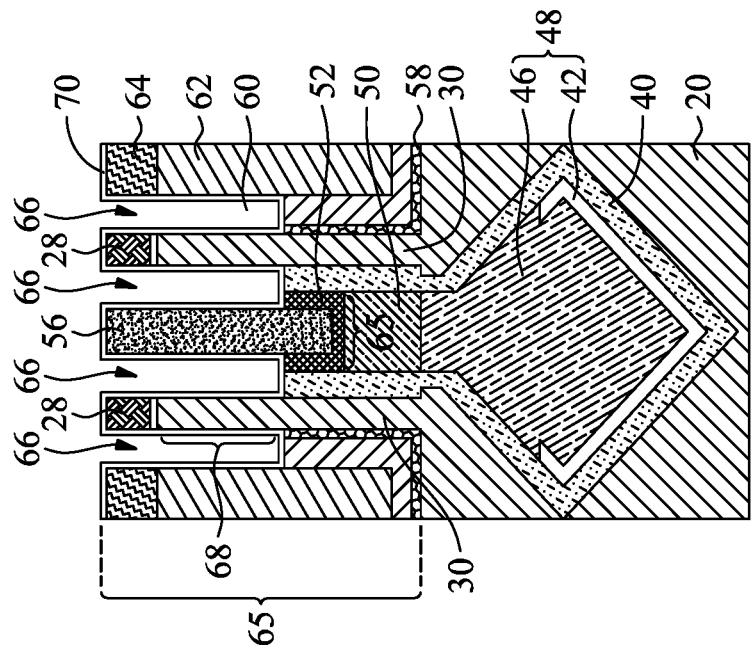

Next, referring to FIG. 16, dielectric layers 40, 52, 58, and 60 are recessed, so that recesses 66 are formed. The sidewalls of semiconductor strips 30 are thus exposed. In accordance with some embodiments of the present disclosure, recesses 66 have bottoms higher than the top surfaces of buried power rail 50. The portions of semiconductor strips 30 higher than the bottoms of recesses 66 are referred to as semiconductor fins 68 or protruding fins 68 hereinafter. The respective process is illustrated as process 220 in the process flow 200 as shown in FIG. 77.

Further referring to FIG. 16, dummy gate dielectric layer 70 is formed. In accordance with some embodiments of the present disclosure, dummy gate dielectric layer 70 is formed of an oxide such as silicon oxide, and other dielectric materials/structures such as silicon nitride may be adopted.

Figure 17B:
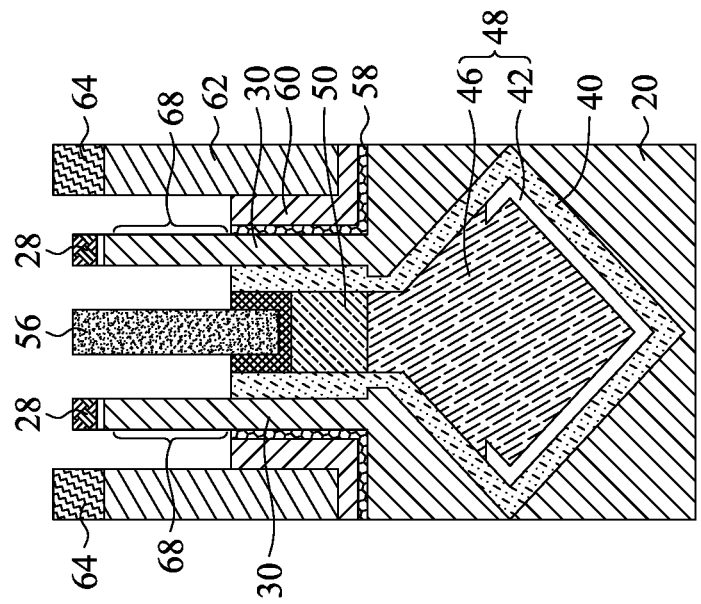
Figure 17A:
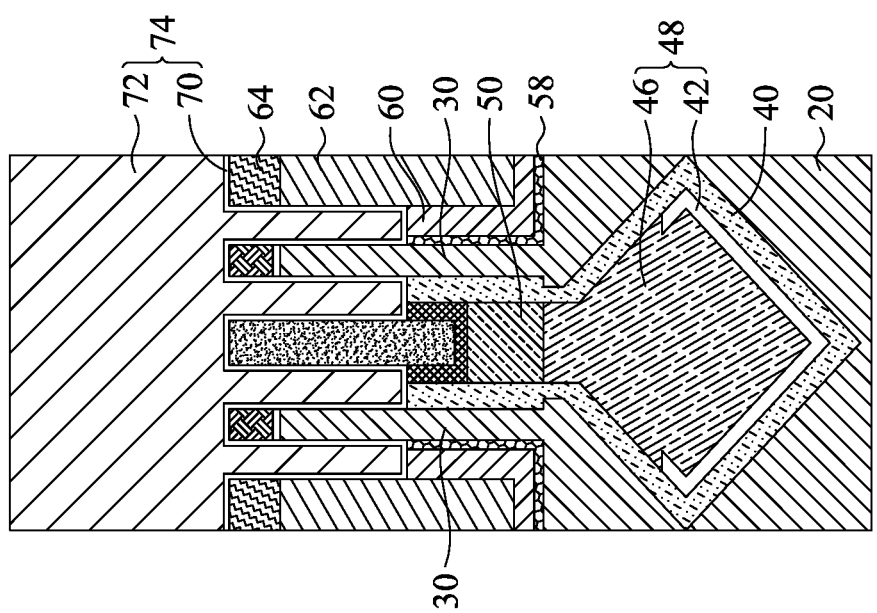

FIG. 17A illustrates the formation of dummy gate electrode layer 72. Dummy gate electrode layer 72 may be formed, for example, using polysilicon, and other materials may also be used. Dummy gate electrode 72 and dummy gate dielectric layer 70 are then patterned to form dummy gate stack 74. The respective process is illustrated as process 222 in the process flow 200 as shown in FIG. 77. Dummy gate stack 74 includes dummy gate electrode 72 and dummy gate dielectric layer 70, and forms an elongate strip crossing over a plurality of semiconductor fins 68. In the patterning process, dielectric layer 64 protects the underlying dielectric region 62 from being etched (as shown in FIG. 17B). When viewed in a top view of the structure shown in FIG. 17A, the lengthwise direction of gate stack 74 is perpendicular to the lengthwise direction of semiconductor fins 68. After the patterning of dummy gate electrode 72 and dummy gate dielectric layer 70, gate spacers (not shown, not in the illustrated plane) are formed on the sidewalls of dummy gate stack 74. In accordance with some embodiments of the present disclosure, the gate spacers are formed of a dielectric material(s) such as silicon nitride, silicon oxide, silicon carbo-nitride, silicon oxynitride, silicon oxy-carbo-nitride, or the like, and may have a single-layer structure or a multi-layer structure including a plurality of dielectric layers.

FIG. 17B illustrates the same structure as in FIG. 17A, except that FIG. 17B is obtained from a plane in which dummy gate electrode 72 and dummy gate dielectric layer 70 are removed, while FIG. 17A is obtained from a plane in which dummy gate electrode 72 and dummy gate dielectric layer 70 remain. The planes from which FIGS. 17A and 17B are obtained are parallel to each other.

FIGS. 18 through 24 illustrate subsequent processes, and the cross-sectional view shown in FIGS. 18 through 24 are the reference cross-section same as the reference cross-section as shown in FIG. 17B. The dummy gate stack 74 as shown in FIG. 17A is thus not in the planes shown in FIGS. 18 through 24. The hard mask layer 28 and pad oxide 26 as shown in FIG. 17B are removed in etching processes, forming the structure shown in FIG. 18. The respective process is illustrated as process 224 in the process flow 200 as shown in FIG. 77. The top surfaces and the sidewalls of semiconductor fins 68 are exposed. Dielectric layer 64 is then removed.

Next, as shown in FIG. 19, source/drain regions 76A and 76B (collectively referred to as source/drain regions 76) are formed. The respective process is illustrated as process 226 in the process flow 200 as shown in FIG. 77. The formation process may include recessing the portions of semiconductor fins 68 that are not covered by dummy gate stack 74 (FIG. 17A) to form recesses, and epitaxially growing source/drain regions from the recesses. In accordance with some embodiments of the present disclosure, epitaxy regions 76 include silicon germanium, silicon, or silicon carbon. Depending on whether the resulting FinFET is a p-type FinFET or an n-type FinFET, a p-type or an n-type impurity may be in-situ doped with the proceeding of the epitaxy. For example, when the resulting FinFET is a p-type FinFET, silicon boron (SiB), silicon germanium boron (SiGeB), GeB, or the like may be grown. Conversely, when the resulting FinFET is an n-type FinFET, silicon phosphorous (SiP), silicon carbon phosphorous (SiCP), silicon, or the like, may be grown. In accordance with alternative embodiments of the present disclosure, epitaxy regions 76 are formed of a III-V compound semiconductor such as GaAs, InP, GaN, InGaAs, InAlAs, GaSb, AlSb, AlAs, AlP, GaP, combinations thereof, or multi-layers thereof. Source/drain regions 76 expand horizontally, and facets may be formed. Source/drain regions 76A and 76B may have the same conductivity type or may be of opposite conductivity types.

FIG. 19 also illustrates the formation of Contact Etch Stop Layer (CESL) 78 and Inter-Layer Dielectric (ILD) 80. The respective process is illustrated as process 228 in the process flow 200 as shown in FIG. 77. CESL 78 may be formed of silicon oxide, silicon nitride, silicon carbo-nitride, or the like. CESL 78 may be formed using a conformal deposition method such as ALD or CVD, for example. ILD 80 may include a dielectric material formed using, for example, FCVD, spin-on coating, CVD, or another deposition method. ILD 80 may also be formed of an oxygen-containing dielectric material, which may be a silicon-oxide based dielectric such as Tetra Ethyl Ortho Silicate (TEOS) oxide, Plasma-Enhanced CVD (PECVD) oxide (including $SiO_2$), Phospho-Silicate Glass (PSG), Boro-Silicate Glass (BSG), Boron-Doped Phospho-Silicate Glass (BPSG), or the like. A planarization process such as a Chemical Mechanical Polish (CMP) process or a mechanical grinding process is performed to level the top surfaces of ILD 80 and dummy gate stacks 74 (FIG. 17A) with each other.

Figure 37:
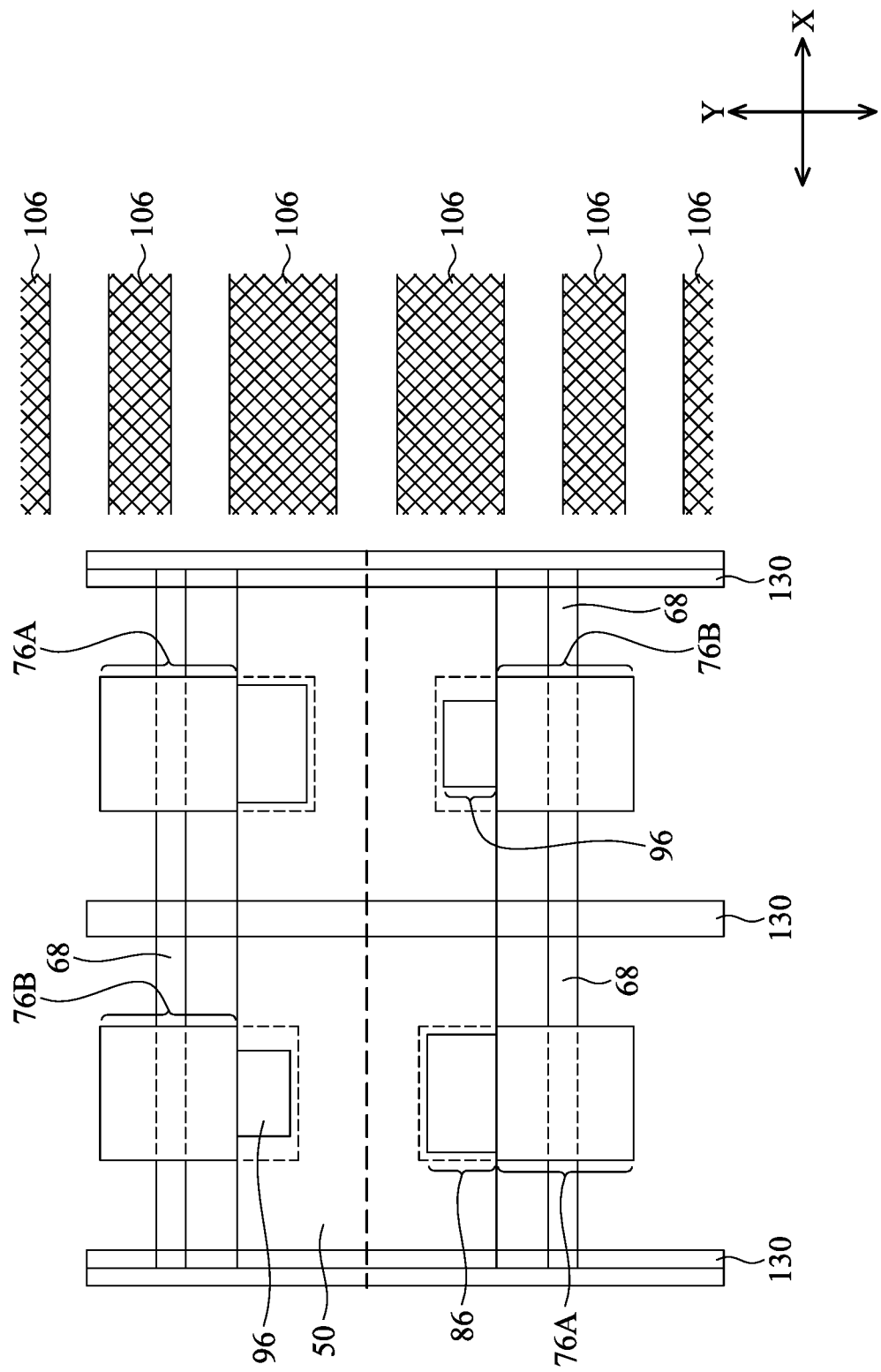
FIG. 37 illustrates a top view of a buried power rail, semiconductor fins, and contact plugs in accordance with some embodiments.

After the formation of ILD 80, the dummy gate stack 74 as shown in FIG. 17A may be replaced with a replacement gate stack, which is illustrated as gate stacks 130 in FIG. 37. The corresponding process may include etching dummy gate stack 74 to form a recess in ILD 80, forming a replacement gate dielectric layer extending into the recess, forming metal-containing layers over the gate dielectric layer, and performing a planarization process to remove excess portions of the gate dielectric layer and the metal-containing layers, with the remaining portions of the gate dielectric layer and the metal-containing layers forming replacement gate dielectric and replacement gate electrode, respectively.

After the formation of the replacement gate stack, referring to FIG. 20, contact opening 82 is formed. The respective process is illustrated as process 230 in the process flow 200 as shown in FIG. 77. The formation of contact opening 82 includes etching CESL 78 and ILD 80. Furthermore, the portions of dielectric layer 52 and filling region 56 that are under and exposed to contact opening 82 are also etched, until buried power rail 50 is exposed. Source/drain region 76A is also exposed. On the other hand, source/drain region 76B may be covered by ILD 80, and is not exposed.

Referring to FIG. 21, source/drain silicide region 84 and contact plug 86 are formed. The respective process is illustrated as process 232 in the process flow 200 as shown in FIG. 77. To form source/drain silicide region 84, a metal layer (such as a Ti layer) is deposited and extending into the contact opening 82. A metal nitride capping layer may be formed. An anneal process is then performed to react the metal layer with the top portion of source/drain region 76A to form silicide region 84. Next, either the previously formed metal nitride layer is left without being removed, or the previously formed metal nitride layer is removed, followed by the deposition of a new metal nitride layer (such as a titanium nitride layer). A filling-metallic material such as tungsten, cobalt, or the like, is then filled into the contact openings, followed by a planarization to remove excess materials, resulting in source/drain contact plug 86. FinFET 100A is thus formed.

Referring to FIG. 22, contact plug 86 is recessed, for example, in an etching process. The resulting recess is then filled with a dielectric material, which may be silicon nitride, silicon oxynitride, silicon oxide, or the like. A planarization process is then performed to remove excess portions of the dielectric material, resulting in dielectric hard mask 90.

Referring to FIG. 23, contact opening 92 is formed. The formation of contact opening 92 includes etching CESL 78 and ILD 80 to expose at least the top surfaces of source/drain region 76B.

Figure 24:
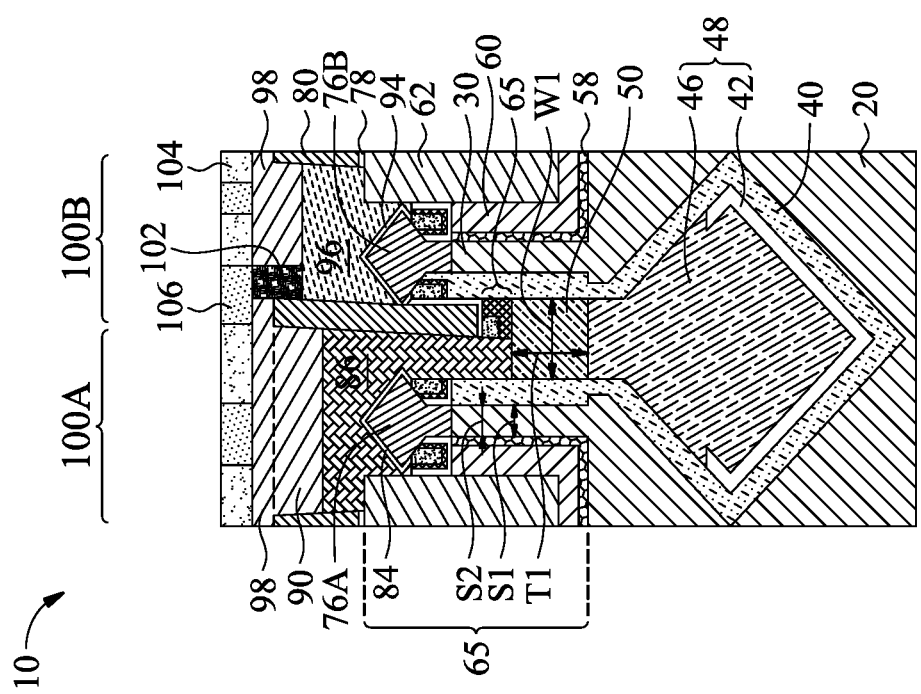

Referring to FIG. 24, source/drain silicide region 94 and contact plug 96 are formed. The formation processes and the materials of source/drain silicide region 94 and contact plug 96 are similar to that of source/drain silicide region 84 and contact plug 86, respectively. The details are thus not discussed. FinFET 100B is thus formed.

Next, contact plug 96 is recessed, and dielectric hard mask 98 is formed. Dielectric hard mask 98 may be formed of silicon nitride, silicon oxynitride, silicon oxide, or the like, and dielectric hard masks 90 and 98 may be formed of a same dielectric material or different dielectric materials.

Next, contact plug 102 is formed in dielectric hard mask 98 to connect to contact plug 96. Dielectric layer 104 and metal line 106 (which is a front-side power rail in accordance with some embodiments) are then formed. The respective process is illustrated as process 234 in the process flow 200 as shown in FIG. 77. In accordance with some embodiments of the present disclosure, dielectric layer 104 is formed of a low-k dielectric material, which may have a dielectric constant lower than about 3.0. Metal line 106 may include a diffusion barrier layer and a filling metal. For example, the diffusion barrier layer may be formed of TiN, TaN, Ti, Ta, or the like. The filling metal may be formed of copper, for example.

As shown in the example embodiment in FIG. 24, buried power rail 50 and the front-side power rail 106 may be formed, and are connected to integrated circuit devices from backside and front side, respectively, of FinFETs. With the formation of buried power rail 50, fewer front-side power rails 106 are needed.

In accordance with some embodiments of the present disclosure, the thickness T1 of buried power rails 50 is in the range between about 20 nm and about 60 nm. The width W1 of buried power rail 50 is in the range between about 20 nm and about 40 nm. The spacing S1 between buried power rail 50 and semiconductor strip 30 is in the range between about 6 nm and about 20 nm. The spacing S2 between contact plug 86 and semiconductor strip 30 is in the range between about 6 nm and about 20 nm.

FIGS. 25 through 36 illustrate the formation of through-vias extending from the backside of semiconductor substrate 20 into semiconductor substrate 20 in order to electrically connect to buried contacts 48 and buried power rail 50. The respective process is illustrated as process 236 in the process flow 200 as shown in FIG. 77. FIGS. 25 through 30 illustrate the formation of via-type through-vias, and FIGS. 31 through 36 illustrate the formation of trench-type through-vias. The processes shown in FIGS. 25 and 31 are continued from the structure shown in FIG. 24. Some features shown in FIG. 24 are not illustrated in FIGS. 25 through 36, and these features may be found referring to FIG. 24 and the corresponding formation processes. Also, FIGS. 25 through 36 are illustrated upside down, while in the actual processes, wafer 10 may have the backside of semiconductor substrate 20 facing up, opposite to what are shown in FIGS. 25 through 36.

Figures 28, 29, 30:
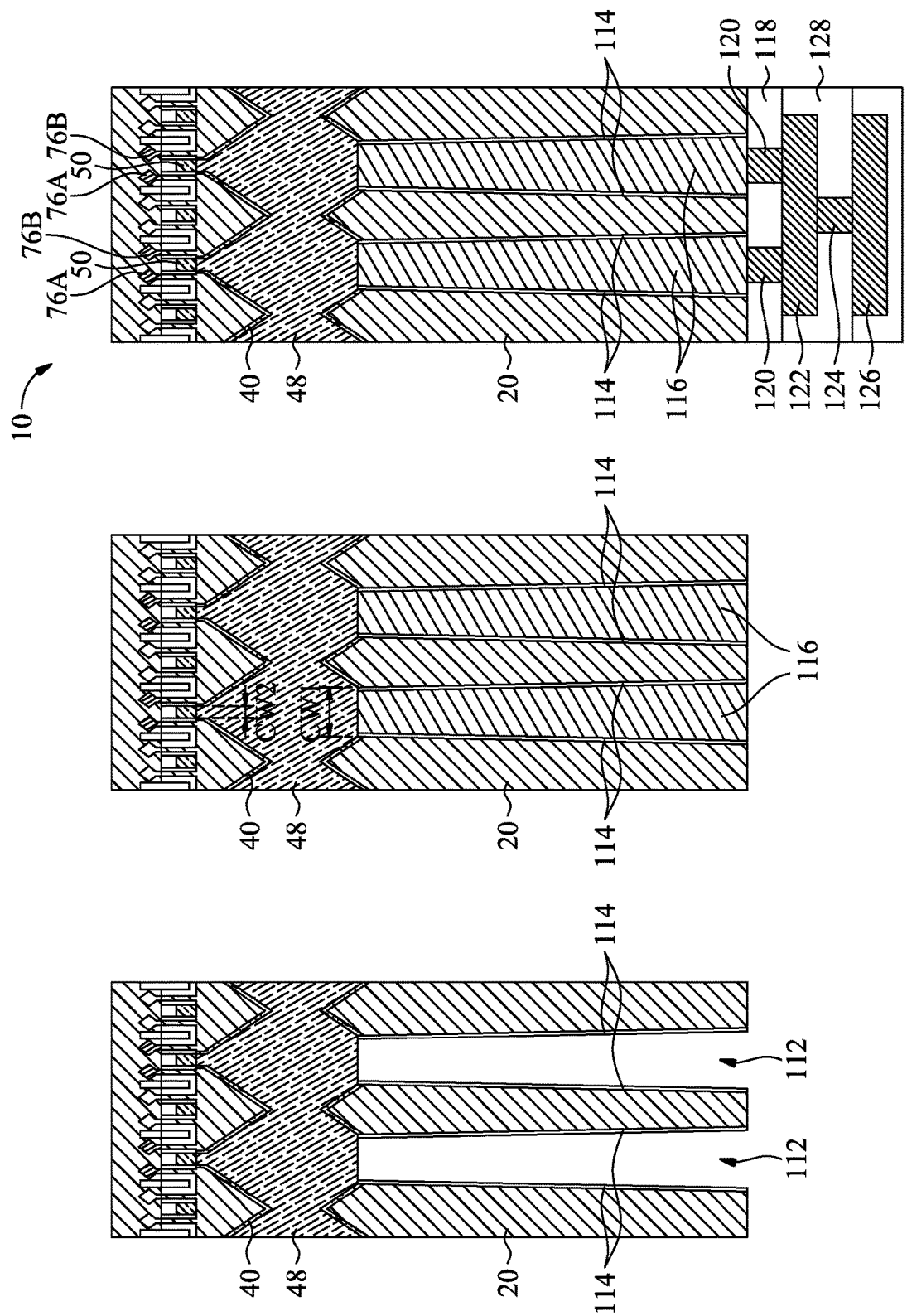

Referring to FIG. 25, a cross-sectional view of the wafer 10 as shown in FIG. 24 is illustrated. Buried power rails 50 and buried contacts 48 are also illustrated. Next, as shown in FIG. 26, etching mask 110, which may be a photo resist, is formed and patterned. As shown in FIG. 27, semiconductor substrate 20 is etched using etching mask 110 to define patterns, so that via openings 112 are formed. Via openings 112 penetrate through semiconductor substrate 20, and dielectric layer 40 is exposed to via openings 112. The exposed portions of dielectric layer 40 are then etched to reveal buried contacts 48, and the resulting structure is shown in FIG. 28. The bottom tip portions of buried contacts 48 may also be etched. Photo resist 110 as shown in FIG. 26 is then removed. Also, dielectric liners 114 are formed on the sidewalls of via openings 112. Dielectric liners 114 may be formed of oxides, nitride, or the like. The formation process may include blanket depositing a conformal dielectric layer, and performing an anisotropic etching to remove the horizontal portions of the conformal dielectric layer.

FIG. 29 illustrates the filling of contact openings 112 with a conductive material(s) to form through-vias 116. Through-vias 116 may be formed of tungsten, copper, cobalt, or the like, and may or may not include a barrier layer formed of titanium nitride, tantalum nitride, titanium, tantalum, or the like. Through-vias 116 is in physical contact with buried contact 48, and the width CW1 of the contact area is greater than the spacing CW2 between semiconductor strips 30. For example, ratio CW1/CW2 may be greater than about 2, and may be in the range between about 2 and about 10. Accordingly, there is very low possibility of misalignment. As a comparison, if buried contact 48 is not formed, a through-via will be formed extending from the back surface of semiconductor substrate 20 to land on buried power rail 50. It is thus more likely to have misalignment problem, and the corresponding through-via may land on semiconductor strips 30 if the misalignment occurs, causing a high leakage current and/or device failure.

FIG. 30 illustrates the formation of dielectric layers 118 and 128, metal vias 120 and 124, and metal lines 122 and 126. Metal lines 122 and 126 and vias 120 and 124 are electrically connected to through-vias 116, buried contacts 48, and buried power rails 50, which are further connected to FinFETs such as the source/drain regions of the FinFETs.

FIGS. 31 through 36 illustrate the formation of trench-type through-vias. The process details are similar to the processes shown in FIGS. 25 through 30, except the resulting through-vias 116 have strip (elongated) shapes. FIG. 31 illustrates the structure as shown in FIG. 24, except a plurality of buried contacts 48 are shown as connected to each other as an elongated strip. Next, as shown in FIG. 32, photo resist 110 is formed and patterned. The illustrate portions of semiconductor substrate 20 are revealed through the opening in photo resist 110. Next, referring to FIG. 33, trench 112' is formed by etching semiconductor substrate 20 (which is not shown in the illustrated region). In FIG. 34, the exposed portions of dielectric layer 40 are etched to reveal buried contact 48. In a subsequent process, a dielectric liner (not shown in the illustrated region) similar to dielectric liner 114 as shown in FIG. 28 is formed, followed by the formation of through-via 116, as shown in FIG. 35. FIG. 36 illustrates the formation of dielectric layers 118 and 128, vias 120 and 124, and metal lines 122 and 126.

FIG. 41 illustrates a bottom view of the structure shown in FIG. 36 in accordance with some embodiments. Through-vias 116 are formed as elongated vias landing on multiple buried contacts 48 that are interconnected as an elongated contact. Each of through-vias 116 is thus connected to a plurality of diamond-shaped buried contacts 48.

FIG. 37 illustrates a layout of a portion of the structure shown in FIG. 24, wherein semiconductor fins 68 have lengthwise directions in the X-direction, and gate stacks 130 have lengthwise directions in the Y-direction. Buried power rail 50 is electrically connected to the source/drain regions 76A through contact plug 86. On the right side of FIG. 37, a plurality of metal lines 106, which are in the metal layers overlying the FinFETs, are illustrated. Metal lines 106 actually extend directly over the region on left part of FIG. 37, and may be electrically connected to source/drain regions 76B through contact plugs 96.

FIG. 38 illustrates the bottom view of the structure having the via-type through-vias (FIG. 30), wherein buried power rails 50, backside metal lines 122 and 126, and through-vias 116 are illustrated. Backside metal lines 122 and 126 may be used as VDD power lines and VSS power lines. Through-vias 116 are formed as discrete vias, which may have the shapes including, and not limited to, square shapes, circular shapes, hexagonal shapes, or the like.

Figure 40:
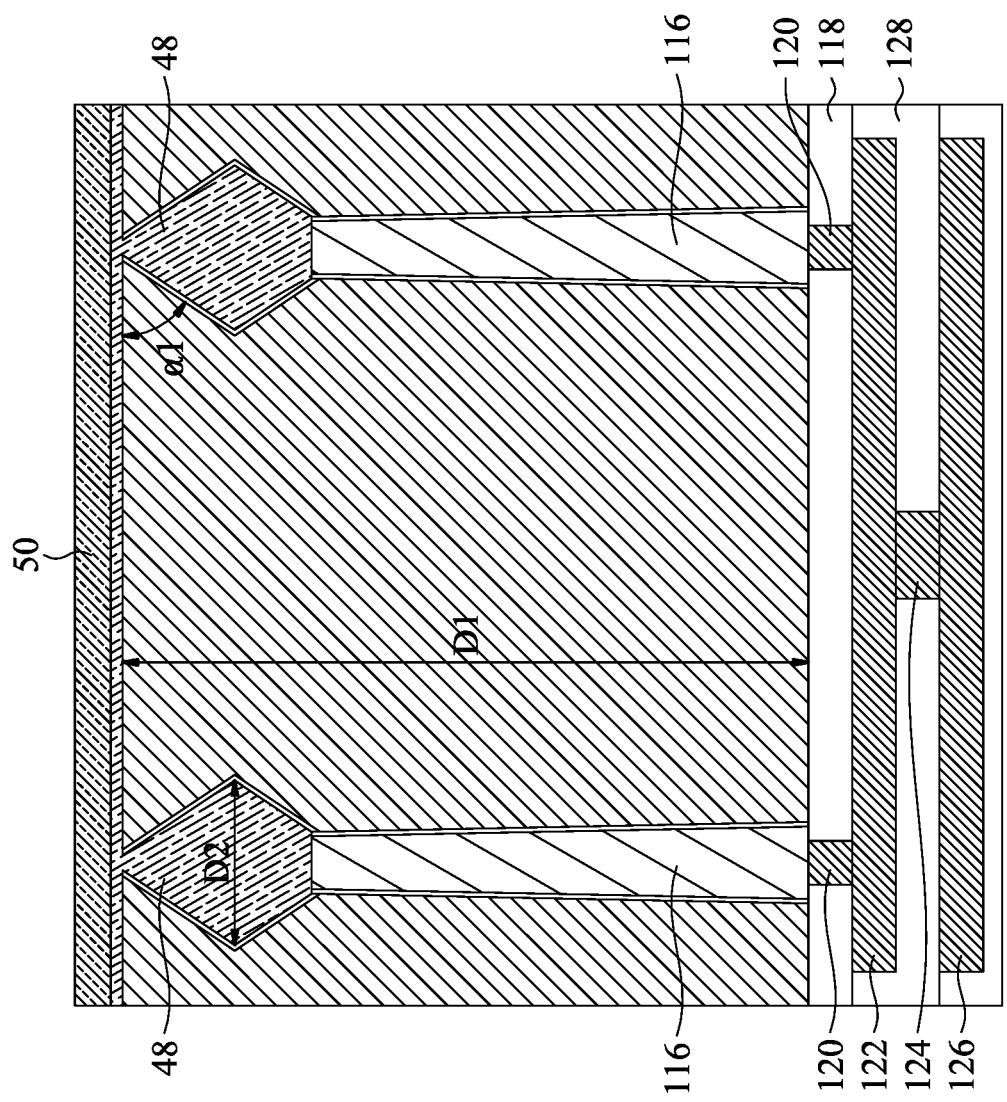
FIGS. 39 and 40 illustrate the cross-sectional views of the structure shown in FIG. 38 in accordance with some embodiments.
Figure 39:
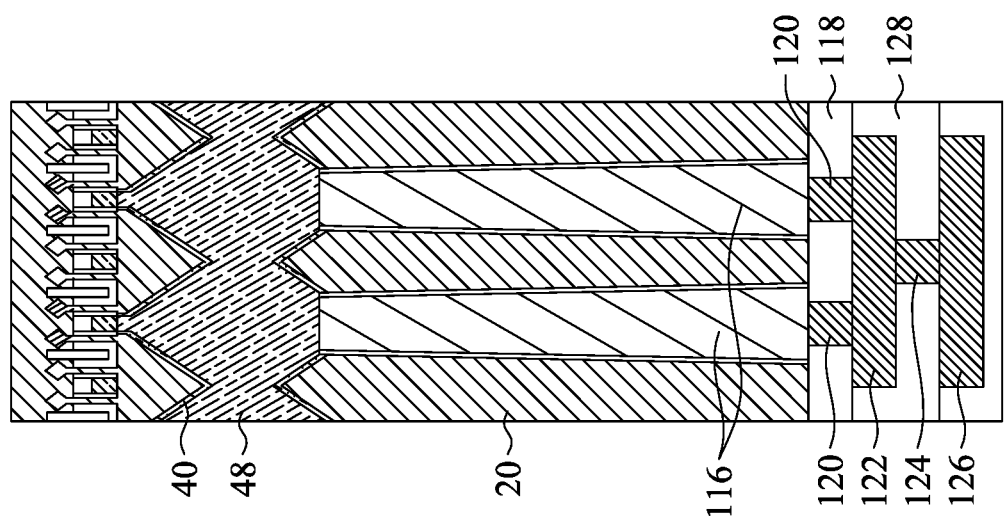

FIGS. 39 and 40 illustrate the cross-sectional views obtained from the reference cross-sections 39-39 and 40-40, respectively, in FIG. 38. Referring to FIG. 40 (and also FIG.

43), the distance D1 between the bottoms of buried power rail 50 to the back surface of semiconductor substrate 20 may be in the range between about 0.5 μm and about 2.5 μm. Distance D1 is also the combined height of buried contact 48 and through-via 116. The distance D2 between opposite tips of the diamond-shaped buried contact 48 may be in the range between about 150 nm and about 400 nm. The tilt angle α1 of the tilted sidewalls of the diamond-shaped buried contact 48 may be in the range between about 53° and about 56°.

FIG. 41 illustrates the bottom view of the structure having the trench-type through-vias. FIGS. 42 and 43 illustrate the cross-sectional views obtained from the reference cross-sections 42-42 and 43-43, respectively, in FIG. 41. The illustrated structure is similar to the structure shown in FIGS. 38 through 40, except elongated through-vias 116 are formed. The details are thus not repeated herein.

FIGS. 44 through 67 illustrate cross-sectional views of intermediate stages in the formation of FinFETs, buried power rails, and buried contacts in accordance with alternative embodiments of the present disclosure. Unless specified otherwise, the materials and the formation processes of the components in these embodiments are essentially the same as the like components, which are denoted by like reference numerals in the embodiments shown in FIGS. 1 through 24, except that an etch stop layer (for example, a silicon germanium (SiGe) layer) is formed so that in the subsequent formation of the trenches, an isotropic etching process, rather than an anisotropic etching process followed by an isotropic etching process (shown in FIG. 2), is adopted. The details regarding the formation process and the materials of the components shown in FIGS. 44 through 67 may thus be found in the discussion of the embodiment shown in FIGS. 1 through 24, unless specified otherwise.

Referring to FIG. 44, semiconductor substrate 20 is formed. Semiconductor substrate 20 may include semiconductor layer 20A, semiconductor layer 20B over semiconductor layer 20A, and semiconductor layer 20C over SiGe layer 20B. Semiconductor layer 20B may be a silicon germanium (SiGe) layer or another type of crystalline material (such as a semiconductor material) that may result in enough etching selectivity relative to semiconductor layer 20A and semiconductor layer 20C. In subsequent discussion, semiconductor layer 20B is referred to as SiGe layer 20B, while semiconductor layer 20B may be formed of other materials. SiGe layer 20B and semiconductor layer 20C may be formed through epitaxy. In accordance with some embodiments of the present disclosure, semiconductor layer 20A and semiconductor layer 20C are formed of crystalline silicon, which may be free from germanium therein. Semiconductor layer 20B may be formed of crystalline SiGe. The germanium atomic percentage of SiGe layer 20B may be in the range between about 30 percent and about 100 percent. In accordance with some embodiments of the present disclosure, the thickness of SiGe layer 20B is in the range between about 5 nm and about 50 nm. Semiconductor layer 20C may also be formed of other types of semiconductor materials such as a III-V compound semiconductor material.

Referring to FIG. 45, patterned pad oxide layer 26 and hard mask layer 28 are formed. Semiconductor layer 20C is then etched using the patterned hard mask layer 28 as an etching mask, forming semiconductor strips 30 as shown in FIG. 45. In the etching process, SiGe layer 20B is used as an etch stop layer, and the top surface of SiGe layer 20B is exposed. The etching selectivity, which is the ratio of the etching rate of semiconductor layer 20C to the etching rate of SiGe layer 20B, is high enough so that SiGe layer 20B is substantially undamaged. The etching selectivity may be higher than about 20 or higher than about 50, for example. FIG. 46 also illustrates the formation of conformal dielectric layer 32, which is formed through a conformal deposition method such as ALD or CVD.

Figure 47:
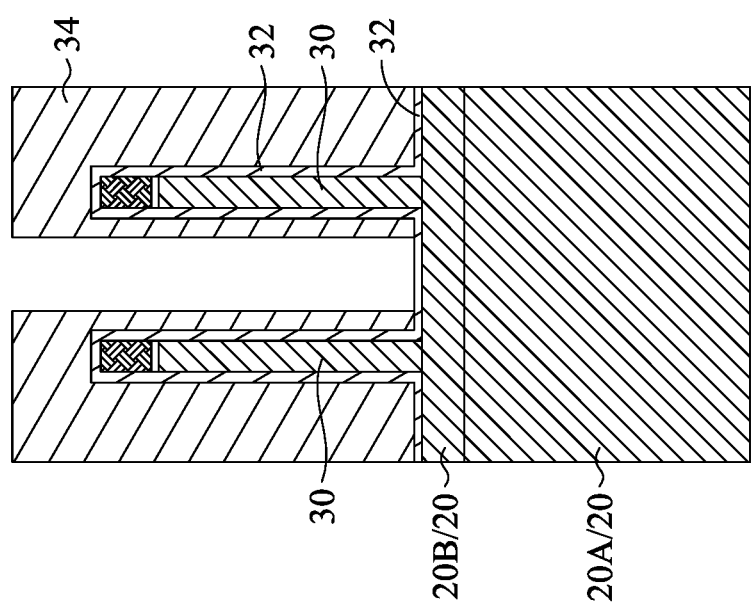
Figure 74:
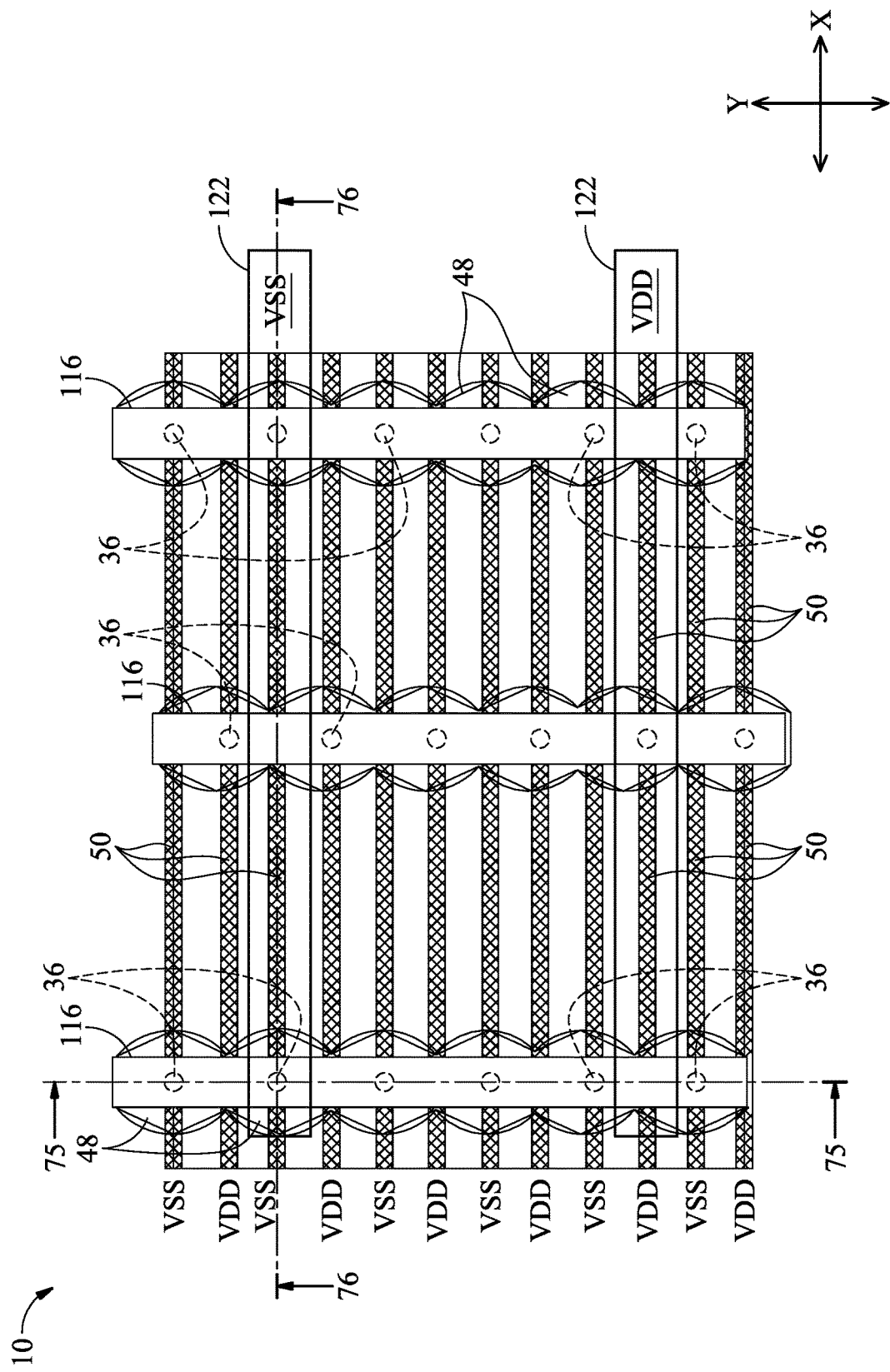
FIG. 74 illustrates a bottom view of buried power rails and buried contacts in accordance with some embodiments.

Next, as shown in FIG. 47, the patterned etching mask 34 is formed, and the patterned etching mask 34 covers semiconductor strips 30, and a portion of the etching mask 34 between neighboring strips 30 is removed. An etching process is then performed to etch the exposed portion of dielectric layer 32 and the underlying portion of SiGe layer 20B, resulting in the structure shown in FIG. 48. In the etching process, semiconductor layer 20A is used as an etch stop layer, so that its top surface is exposed. Trench 36 is thus formed extending into SiGe layer 20B. If viewed from top, trench 36 is one of a plurality of discrete trenches 36 that are aligned to a straight line (FIG. 74). The top-view shape of trench 36 may be selected from, and not limited to, squares, rectangles, circles, or the like. Also, referring to FIG. 74, which is a bottom view of wafer 10, the positions of discrete trenches 36 will be aligned to straight lines extending in the Y-direction. After the etching process, etching mask 34 (FIG. 47) is removed.

Figure 48:
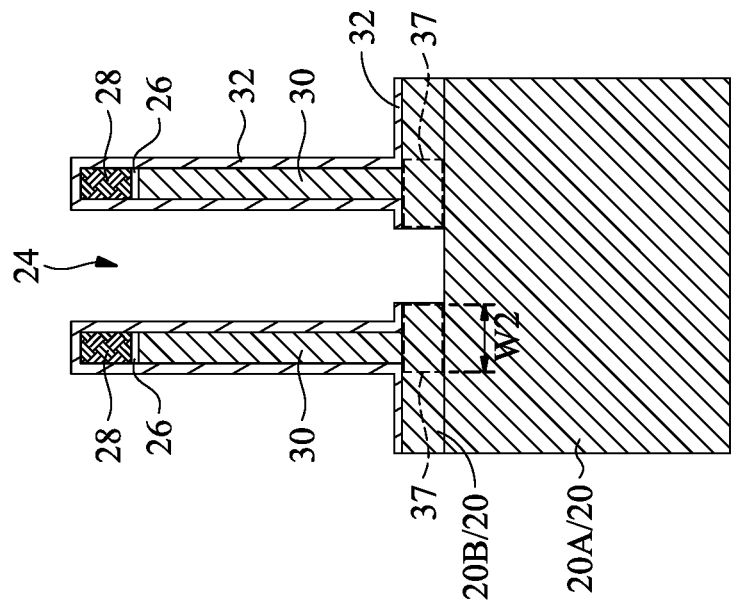

Referring FIG. 48, an oxidation process is performed in accordance with some embodiments of the present disclosure. The oxidation may be performed in an oxygen ($O_2$) containing environment, such as an oven including air therein. The oxidation may be performed at a temperature in a range between about 400° C. and about 700° C. As a result of the oxidation process, silicon germanium oxide (SiGeO) regions 37 are formed. If viewed in a top view, silicon germanium oxide regions 37 form a full circle encircling trench 36. In accordance with some embodiments of the present disclosure, width W2 of silicon germanium oxide regions 37 may be in the range between about 1 nm and about 30 nm. In accordance with alternative embodiments, the oxidation process is skipped. Silicon germanium oxide regions 37 are illustrated as dashed lines to indicate they may be, or may not be, formed in accordance with some embodiments. Although oxide is also formed on the surface of semiconductor layer 20A, when semiconductor layer 20A is formed of silicon, its oxidation rate is significantly lower than that of SiGe, and the resulting silicon oxide is not illustrated in FIG. 48.

Referring to FIG. 49, semiconductor layer 20A is etched, for example, using an etching gas or etching solution that attacks semiconductor layer 20A, but does not attack SiGe layer 20B and dielectric layer 32. Trench 36 thus extends down into semiconductor layer 20A. The etching is isotropic. Since no anisotropic etch was performed before the isotropic etching, the sidewalls (not shown) and the bottoms of trench 36 are rounded, rather being on (111) surface planes. In the isotropic etching, silicon germanium oxide regions 37 and SiGe layer 20B act as a protection layer to protect semiconductor strips 30 from being etched. Furthermore, silicon germanium oxide regions 37 may have a lower etching rate than SiGe layer 20B. The bottom surfaces of silicon germanium oxide regions 37 and SiGe layer 20B are exposed to trench 36. As shown in FIG. 74, neighboring trenches 36 are interconnected to form elongated strips extending in the Y-direction.

Next, dielectric layer 32 is removed, and dielectric layer 40 is formed, as shown in FIG. 50. Dielectric layer 40 is formed as a conformal layer (for example, using ALD), which protects the sidewalls and the bottom surfaces of silicon germanium oxide regions 37 and SiGe layer 20B. Furthermore, the top surface of the bulk semiconductor substrate 20, which top surface is exposed to trenches 36, is also protected by dielectric layer 40.

FIG. 51 illustrates the formation of conductive seed layer 42 and sacrificial material 44. Conductive seed layer 42 may be formed using ALD or CVD. Sacrificial material 44 may fill trench 36 substantially fully, and may further embed semiconductor strips 30 therein.

FIG. 52 illustrates the recess of sacrificial material 44. The remaining sacrificial material 44 has a top surface lower than the bottom surface of SiGe layer 20B. The portions of sacrificial material 44 outside trench(es) 36 are fully removed, and a bottom portion of sacrificial material 44 is left in trench 36. Next, conductive seed layer 42 is etched. The bottom portion of conductive seed layer 42 protected by sacrificial material 44 is not etched, and remains after the etching, while the unprotected portions of conductive seed layer 42 are removed. Next, the remaining sacrificial material 44 is removed, and the resulting structure is shown in FIG. 53.

FIG. 54 illustrates the formation of conductive material 46, which may be formed through plating. Conductive material 46 fills trench 36. Buried contact 48, which includes conductive seed layer 42 and conductive material 46 is thus formed. In accordance with some embodiments of the present disclosure, the top surface of buried contact 48 is level with or higher than the top surface of SiGe layer 20B.

Referring to FIG. 55, buried power rail 50 and conductive strips 51 are formed, for example, through deposition, possibly planarization, and etch-back processes. Accordingly, at least a part, and possibly an entirety, of buried power rail 50 is at the same level as a lower portion of semiconductor strips 30.

Referring to FIG. 56, dielectric layer 52 is deposited as a conformal layer. Etching mask 54 is then formed and patterned. In subsequent processes, as shown in FIG. 57, a plurality of layers and regions are etched. In the etching processes, etching mask 54 is used to etch the exposed portions of dielectric layer 52 first, and hence the underlying conductive strips 51 are revealed. The revealed conductive strips 51 are then etched. Next, the underlying portions of dielectric layer 40, which are exposed, are also etched. The top surface of SiGe layer 20B is thus exposed.

Referring to FIG. 58, filling region 56 is used to fill the recess between neighboring semiconductor strips 30. Dielectric layers 58 and 60 are then formed, as shown in FIG. 59. Next, dielectric region 62 is formed to have a planar top surface, as shown in FIG. 60, followed by recessing dielectric region 62, filling and planarizing dielectric layer 64, and etching back dielectric layer 64. The resulting structure is shown in FIG. 61.

FIG. 62 illustrates a planarization process, in which dielectric layer 64 is used as a stop layer to stop the planarization. Next, as shown in FIG. 63, dielectric layers 40, 52, 58, and 60 are recessed, so that recesses 66 are formed. The sidewalls of semiconductor strips 30 are thus exposed. In accordance with some embodiments of the present disclosure, recesses 66 have bottoms higher than the top surface of buried power rails 50. The portions of semiconductor strips 30 higher than the bottoms of recesses 66 are referred to as semiconductor fins 68 or protruding fins 68 hereinafter.

Figures 64A, 64B:
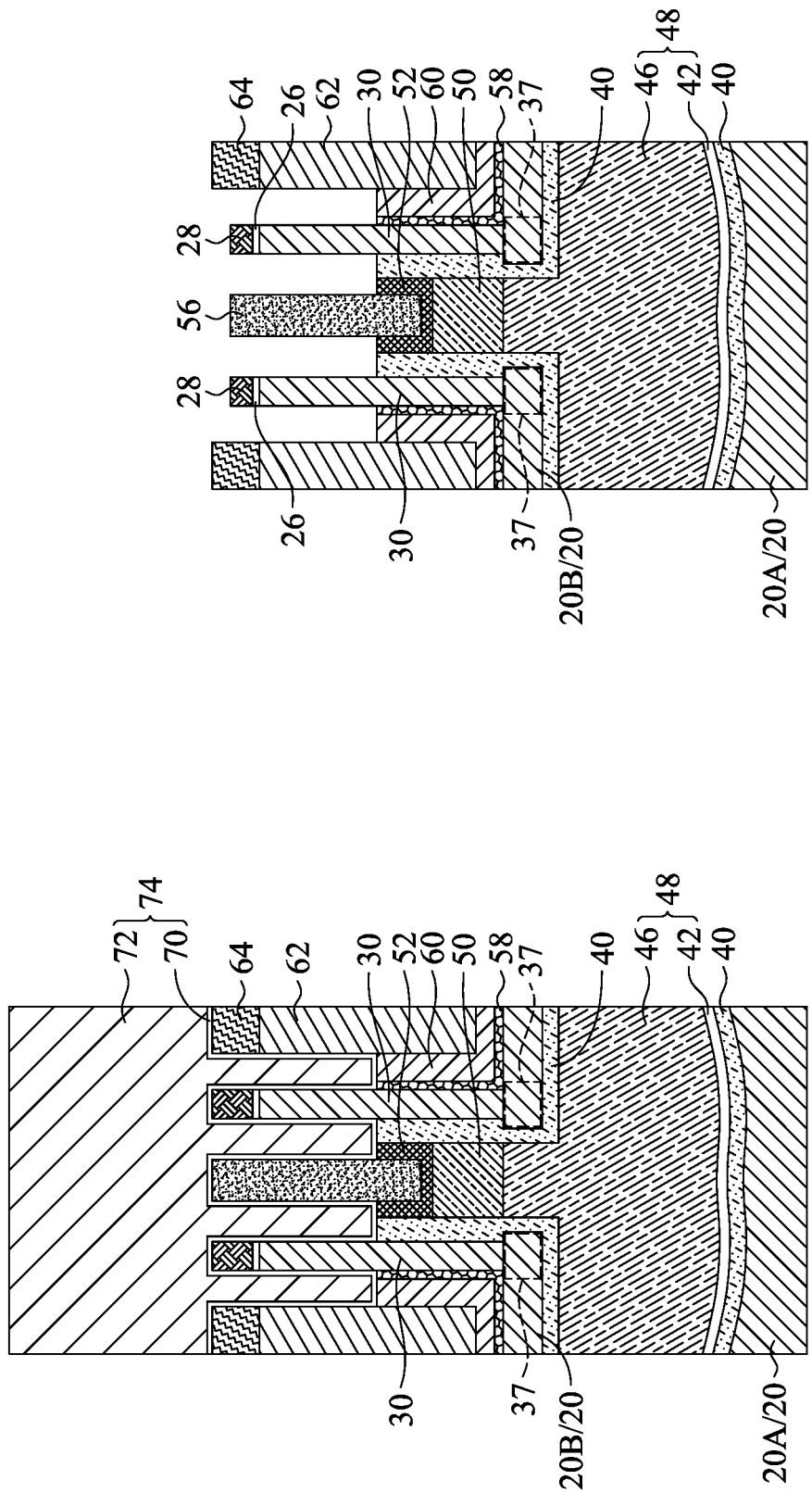

FIG. 64A illustrates the formation of dummy gate stack 74, which includes dummy gate dielectric 70 and dummy gate electrode 72. FIG. 64B shows the same structure as shown in FIG. 64A, except that the cross-sectional view shown in FIG. 64A is obtained from the plane containing dummy gate stack 74, and the cross-sectional view shown in FIG. 64B is obtained from the plane that does not include dummy gate stack 74.

Figure 66:
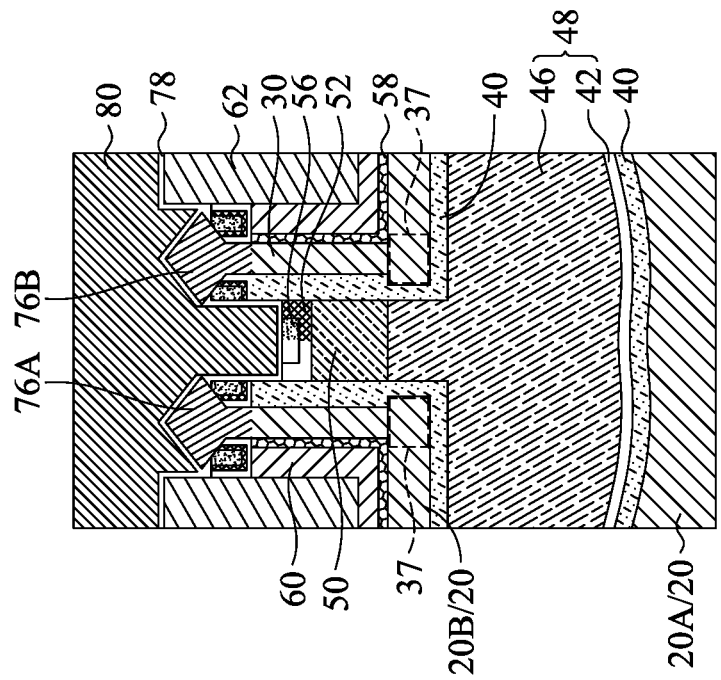
Figure 65:
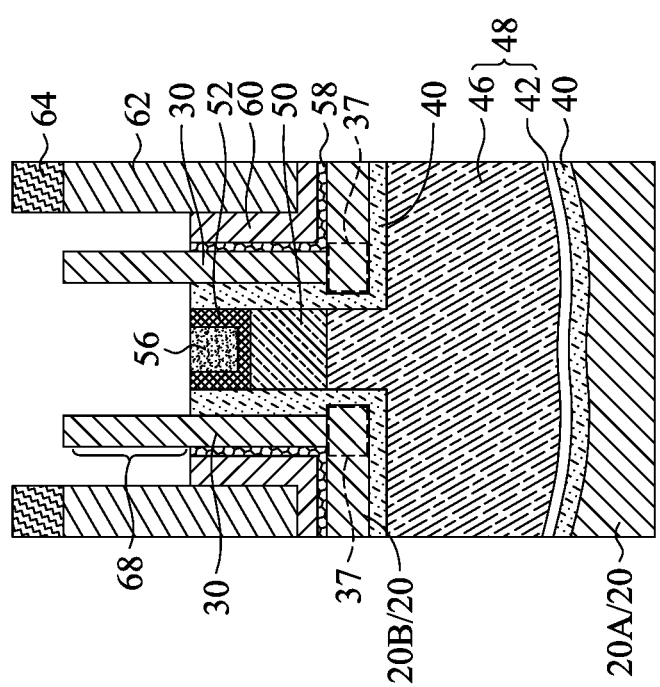
Figure 67:
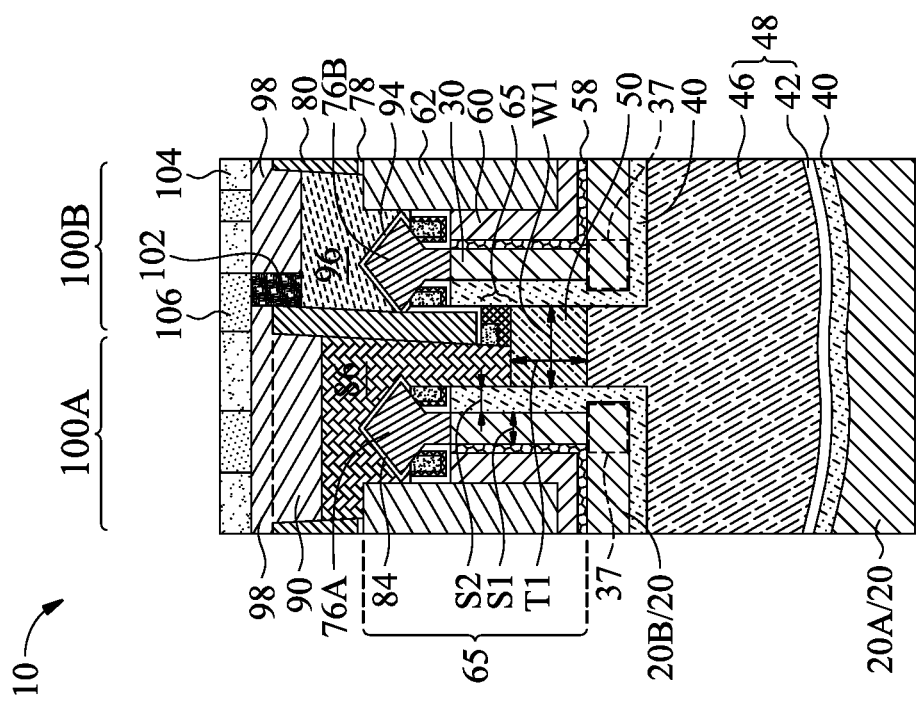

Pad oxide layer 26 and hard mask layer 28 as shown in FIG. 64B are then removed, and the resulting structure is shown in FIG. 65. Dielectric layer 64 is then removed. Next, as shown in FIG. 66, source/drain regions 76 (including 76A and 76B) are formed, followed by the formation of CESL 78 and ILD 80. In FIG. 67, ILD 80 and CESL 78 are etched, and source/drain silicide region 84 is formed on source/drain region 76A. Contact plug 86 is formed to electrically connect source/drain silicide region 84 to buried power rail 50. Dielectric hard mask 90 is formed to cover contact plug 86. Source/drain silicide region 94 is formed on source/drain region 76B. Contact plug 96 is formed to electrically connect to source/drain silicide region 94. Dielectric hard mask 98 is formed to cover contact plug 96. Contact plug 102, dielectric layer 104, and metal line 106 (which may be a front-side power rail) are then formed. Contact plug 96 electrically connects source/drain silicide region 94 to front-side power rail 106. FinFETs 100A and 100B are thus formed.

In accordance with some embodiments of the present disclosure, the thickness T1 of buried power rails 50 is in the range between about 15 nm and about 60 nm. The width W1 of buried power rails 50 is in the range between about 15 nm and about 40 nm. The spacing S1 between buried power rails 50 and the nearest semiconductor strip 30 is in the range between about 6 nm and about 20 nm. The spacing S2 between contact plug 86 and the nearest semiconductor strip 30 is in the range between about 6 nm and about 20 nm.

Figures 68, 69, 70:
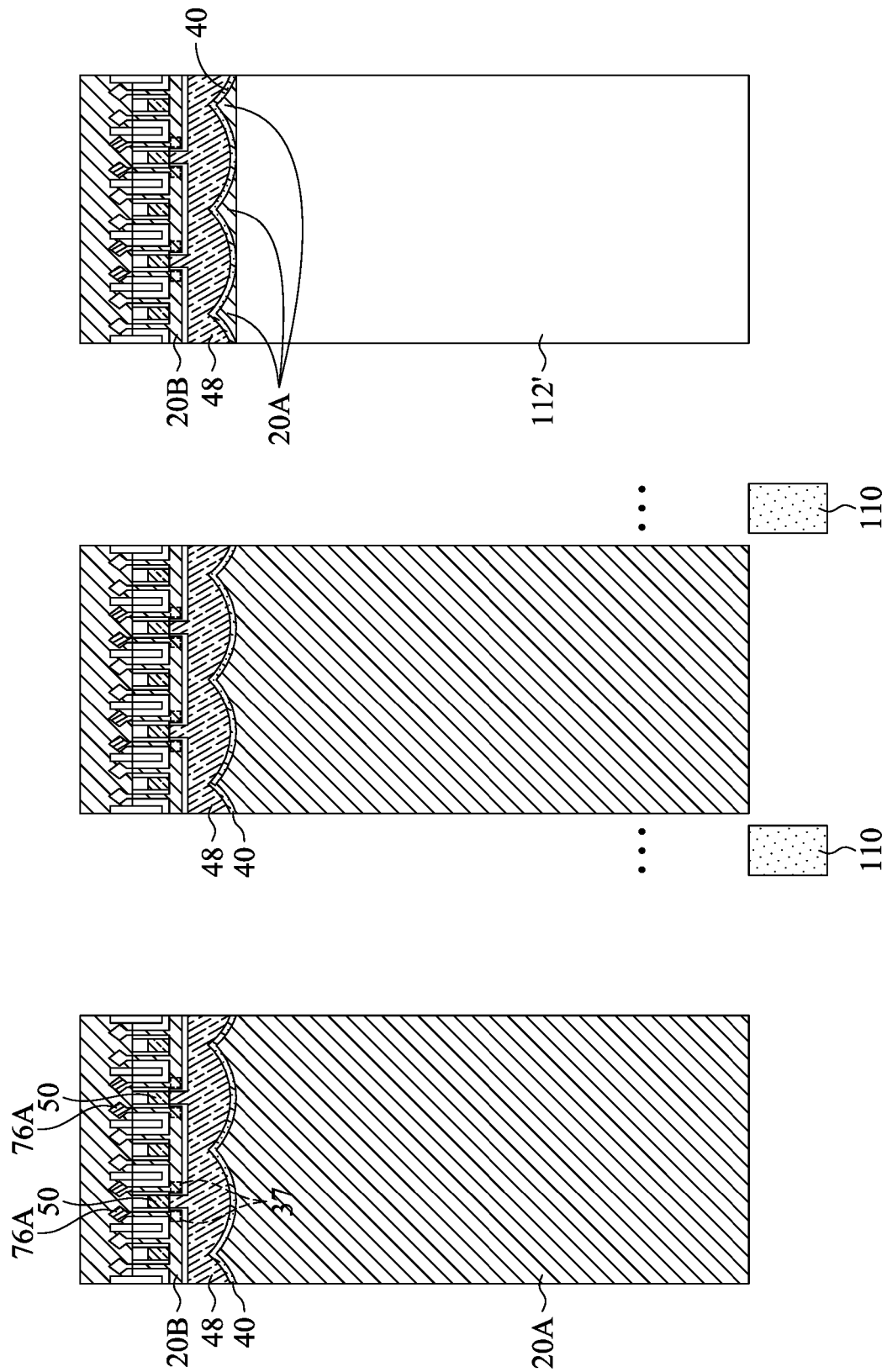

FIGS. 68 through 73 illustrate the formation of through-vias penetrating through semiconductor substrate 20 to connect to buried contact 48. FIG. 68 illustrates the same structure as in FIG. 67, with some details not shown, which details may be found from FIG. 67 and the corresponding formation processes. Referring to FIG. 69, etching mask 110 is formed on the backside of semiconductor substrate 20. Next, as shown in FIG. 70, semiconductor substrate 20 is etched to form via opening 112', and then etching mask 110 is removed. FIG. 71 illustrates the etching of dielectric layer 40 to expose buried contacts 48. Next, through-via 116 is formed, as shown in FIG. 72. There may be some portions of semiconductor layer 20A left between the rounded bottom surfaces of buried contacts 48. FIG. 73 illustrates the formation of dielectric layers 118 and 128, metal vias 120 and 124, and metal lines 122 and 126. Metal line 122 and 126 and vias 120 and 124 are connected to through-vias 116, buried contacts 48, and buried power rails 50, which are further connected to FinFETs such as the source/drain regions of the FinFETs.

FIGS. 68 through 73 illustrate the formation of trench-type through-vias 116. In accordance with alternative embodiments of the present disclosure, via-type through-vias may be formed. The formation process and the resulting structure are essentially the same as what are shown in FIGS. 25 through 30, except the trenches 36 (and buried contact 48) are formed as rounded surfaces rather than having diamond-shapes.

FIG. 74 illustrates a bottom view of the structure having the trench-type through-vias 116, wherein buried power rails 50, through-vias 116, backside metal lines 122, which are used as VDD power lines and VSS power lines, are illustrated.

Figure 76:
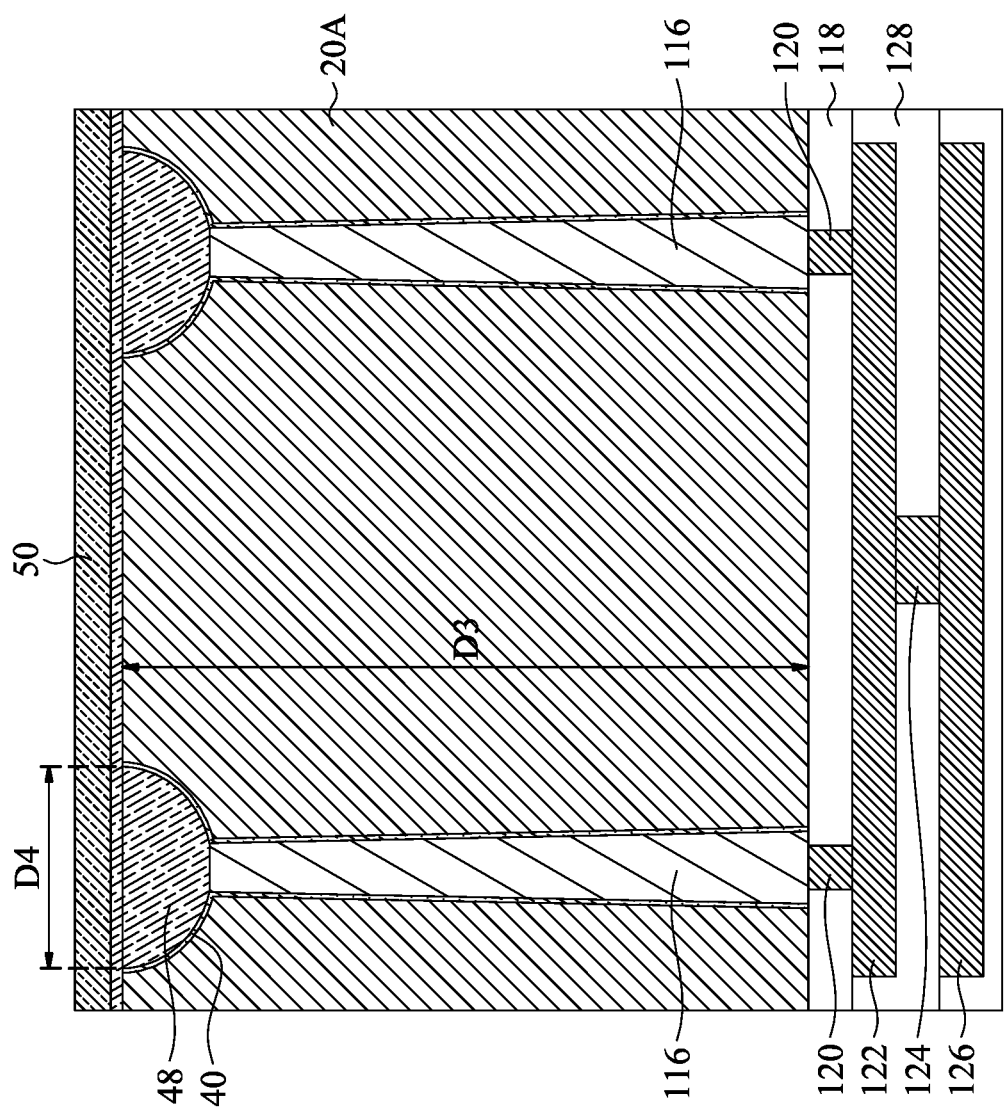
FIGS. 75 and 76 illustrate the cross-sectional views of the structure shown in FIG. 74 in accordance with some embodiments.
Figure 75:
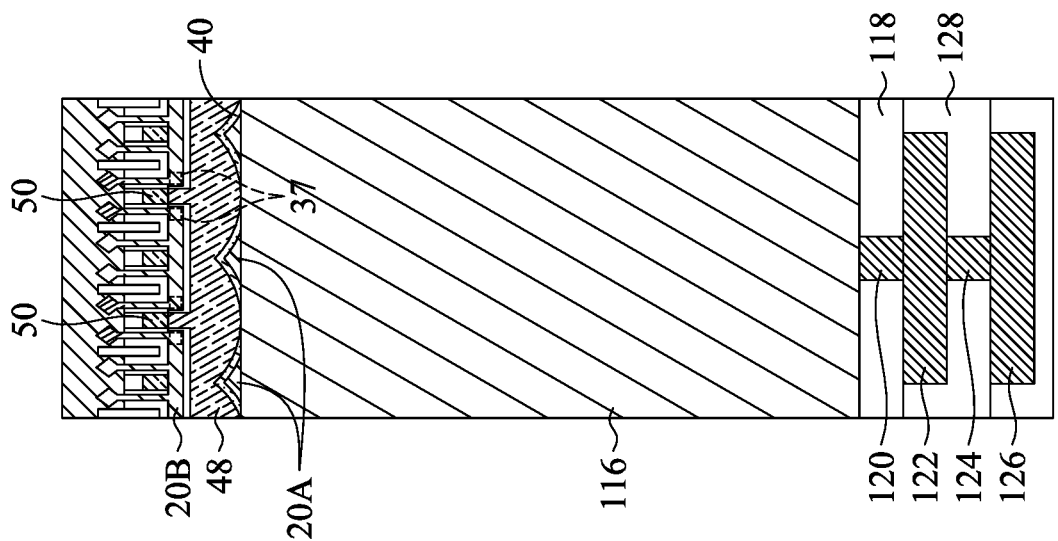

FIGS. 75 and 76 illustrate the cross-sectional views obtained from the reference cross-sections 75-75 and 76-76, respectively, in FIG. 74. Referring to FIG. 75, the distance D3 between the bottom of buried power rail 50 and the back surface of semiconductor substrate 20 may be in the range between about 0.5 µm and about 2.5 µm. Distance D3 is also the combined height of buried contact 48 and through-via 116. The diameter D4 of the rounded buried contact 48 may be in the range between about 100 nm and about 400 nm.

The embodiments of the present disclosure have some advantageous features. Buried power rails may replace some of the front-side power rails, and the density of the front-side power rail is reduced. It is difficult to align through-vias to the buried power rail if buried contacts are not formed, and if misalignment occurs, semiconductor strips may be damaged. By forming buried contacts, which are wider than the respective overlying buried power rail, the through-vias in the semiconductor substrate may easily land on the buried contacts, and the misalignment issues are eliminated.

In accordance with some embodiments of the present disclosure, a method of forming an integrated circuit structure comprises etching a semiconductor substrate to form two semiconductor strips, wherein the two semiconductor strips are over a bulk portion of the semiconductor substrate; etching the bulk portion to form a trench in the bulk portion of the semiconductor substrate; forming a liner dielectric layer lining the trench; forming a buried contact in the trench; forming a buried power rail over and connected to the buried contact, wherein the buried power rail is between the two semiconductor strips; and forming isolation regions on opposite sides of the two semiconductor strips, wherein the buried power rail is underlying a portion of the isolation regions. In an embodiment, the buried power rail is at a same level as a portion of the two semiconductor strips. In an embodiment, the method further comprises recessing the isolation regions, wherein top portions of the two semiconductor strips protrude higher than top surfaces of remaining portions of the isolation regions to form a first semiconductor fin and a second conductor fin; forming a first source/drain region based on the first semiconductor fin; and forming a contact plug to electrically connect the first source/drain region to the buried power rail and the buried contact. In an embodiment, the top surfaces of the remaining portions of the isolation regions are higher than a top surface of the buried power rail. In an embodiment, the forming the contact plug comprises etching the portion of the isolation regions to form a contact opening, wherein the buried power rail is exposed to the contact opening; and filling the contact opening to form the contact plug. In an embodiment, the forming the buried contact comprises: forming a seed layer lining the trench, with the seed layer on the liner dielectric layer; removing a top portion of the seed layer, with a bottom portion of the seed layer remaining; and plating a conductive material starting from the bottom portion of the seed layer. In an embodiment, the etching the bulk portion to form the trench comprises: performing an anisotropic etching to form a portion of the trench extending into the bulk portion; and performing an isotropic etching to expand the trench, wherein after being expanded, the trench has a diamond-shaped cross-sectional view shape. In an embodiment, the semiconductor substrate comprises: a first semiconductor layer; a silicon germanium layer over the first semiconductor layer; and a second semiconductor layer over the silicon germanium layer, wherein the etching the semiconductor substrate comprises etching the second semiconductor layer and stopping on the silicon germanium layer. In an embodiment, the etching the bulk portion to form the trench comprises: etching-through the silicon germanium layer; and performing an oxidation to oxidize a portion of the silicon germanium layer.

In accordance with some embodiments of the present disclosure, a method of forming an integrated circuit structure comprises forming a first semiconductor strip and a second semiconductor strip over a bulk portion of a semiconductor substrate; forming a buried power rail between the first semiconductor strip and the second semiconductor strip, wherein the buried power rail is at a same level as a first portion of the first semiconductor strip; forming a source/drain region based on a second portion of the first semiconductor strip, wherein the second portion is higher than the first portion; forming a buried contact extending into the bulk portion of a semiconductor substrate; etching the bulk portion of the semiconductor substrate to form a contact opening, wherein the buried contact is exposed to the contact opening; and filling the contact opening to forming a through-via, wherein the through-via is electrically coupled to the buried power rail through the buried contact. In an embodiment, the method further comprises forming a contact plug electrically connecting the source/drain region to the buried power rail. In an embodiment, the forming the buried contact comprises: etching the bulk portion from a front side of the semiconductor substrate to form a trench extending into the bulk portion of the semiconductor substrate; and filling the trench with a conductive material to form the buried contact. In an embodiment, the etching the bulk portion comprises: performing an anisotropic etching to form a portion of the trench extending into the bulk portion; and performing an isotropic etching to expand the trench, wherein the trench has a diamond-shaped cross-sectional view shape. In an embodiment, the etching the bulk portion is performed using isotropic etching, and a silicon germanium layer in the bulk portion of the semiconductor substrate is exposed to the trench after the etching. In an embodiment, the buried contact is formed to have a diamond shape in a cross-sectional view of the buried contact. In an embodiment, the method further comprises forming a plurality of additional buried contacts in the bulk portion, wherein the plurality of additional buried contacts are joined with the buried contact to form an elongated contact.

In accordance with some embodiments of the present disclosure, an integrated circuit structure comprises a bulk semiconductor substrate; a first semiconductor strip and a second semiconductor strip over and connected to the bulk semiconductor substrate; a buried power rail between the first semiconductor strip and the second semiconductor strip, wherein the buried power rail is at a same level as a first portion of the first semiconductor strip; a buried contact extending into the bulk semiconductor substrate and electrically connecting to the buried power rail; and a through-via extending from a back surface of the bulk semiconductor substrate to the buried contact. In an embodiment, the buried contact comprises a first portion overlapped by a space between the first semiconductor strip and the second semiconductor strip; and a second portion and a third portion overlapped by the first semiconductor strip and the second semiconductor strip, respectively. In an embodiment, the buried contact has a diamond shape, and a top portion of the diamond shape is in contact with a bottom surface of the buried power rail. In an embodiment, the buried contact has rounded surfaces.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming an integrated circuit structure, the method comprising:
   etching a semiconductor substrate to form two semiconductor strips, wherein the two semiconductor strips are over a bulk portion of the semiconductor substrate;
   etching the bulk portion to form a trench in the bulk portion of the semiconductor substrate;
   forming a liner dielectric layer lining the trench;
   forming a buried contact in the trench;
   forming a buried power rail over and connected to the buried contact, wherein the buried power rail is between the two semiconductor strips; and
   forming isolation regions on opposite sides of the two semiconductor strips, wherein the buried power rail is underlying a portion of the isolation regions.

2. The method of claim 1, wherein the etching the bulk portion to form the trench comprises:
   performing an anisotropic etching to form a portion of the trench extending into the bulk portion; and
   performing an isotropic etching to expand the trench, wherein after being expanded, the trench has a diamond-shaped cross-sectional view shape.

3. The method of claim 1, wherein the forming the buried contact comprises:
   forming a seed layer lining the trench, with the seed layer on the liner dielectric layer;
   removing a top portion of the seed layer, with a bottom portion of the seed layer remaining; and
   plating a conductive material starting from the bottom portion of the seed layer.

4. The method of claim 1, wherein the buried power rail is at a same level as a portion of the two semiconductor strips.

5. The method of claim 1, wherein the semiconductor substrate comprises:
   a first semiconductor layer;
   a silicon germanium layer over the first semiconductor layer; and
   a second semiconductor layer over the silicon germanium layer, wherein the etching the semiconductor substrate comprises etching the second semiconductor layer and stopping on the silicon germanium layer.

6. The method of claim 5, wherein the etching the bulk portion to form the trench comprises:
   etching-through the silicon germanium layer; and
   performing an oxidation to oxidize a portion of the silicon germanium layer.

7. The method of claim 1 further comprising:
   recessing the isolation regions, wherein top portions of the two semiconductor strips protrude higher than top surfaces of remaining portions of the isolation regions to form a first semiconductor fin and a second conductor fin;
   forming a first source/drain region based on the first semiconductor fin; and
   forming a contact plug to electrically connect the first source/drain region to the buried power rail and the buried contact.

8. The method of claim 7, wherein the forming the contact plug comprises:
   etching the portion of the isolation regions to form a contact opening, wherein the buried power rail is exposed to the contact opening; and
   filling the contact opening to form the contact plug.

9. The method of claim 7, wherein the top surfaces of the remaining portions of the isolation regions are higher than a top surface of the buried power rail.

10. A method of forming an integrated circuit structure, the method comprising:
    etching a semiconductor substrate to form two semiconductor strips, wherein the two semiconductor strips are over a bulk portion of the semiconductor substrate;
    etching the bulk portion to form a trench in the bulk portion of the semiconductor substrate, wherein the trench comprises a first portion laterally between the two semiconductor strips, and second portions overlapped by the two semiconductor strips;
    forming a liner dielectric layer lining the trench;
    forming a buried contact in the trench;
    forming a buried power rail over and connected to the buried contact, wherein the buried power rail is between the two semiconductor strips; and
    forming isolation regions on opposite sides of the two semiconductor strips, wherein the buried power rail is underlying a portion of the isolation regions.

11. The method of claim 10, wherein the etching the bulk portion to form the trench comprises:
    performing a first etching process to form the trench having straight-and-vertical sidewalls; and
    performing a second etching process to expand a bottom portion of the trench, wherein after being expanded, the trench has slanted sidewalls.

12. The method of claim 10, wherein the buried power rail comprises tungsten.

13. The method of claim 10, wherein the forming the buried contact comprises:
    forming a metal seed layer lining the trench;
    removing a top portion of the metal seed layer, with a bottom portion of the metal seed layer remaining;
    and plating a conductive material starting from the bottom portion of the metal seed layer.

14. The method of claim 13, wherein the removing the top portion of the metal seed layer comprises:
    filling a sacrificial material into the trench;
    etching back the sacrificial material to a level where the top portion joins the bottom portion of the metal seed layer;
    etching the metal seed layer using the sacrificial material as an etching mask; and
    removing the sacrificial material.

15. The method of claim 10 further comprising:
    recessing the isolation regions, wherein top portions of the two semiconductor strips protrude higher than top surfaces of remaining portions of the isolation regions to form a first semiconductor fin and a second conductor fin;
    forming a first source/drain region based on the first semiconductor fin; and
    forming a contact plug to electrically connect the first source/drain region to the buried power rail and the buried contact.

16. The method of claim 15, wherein the top surfaces of the remaining portions of the isolation regions are higher than a top surface of the buried power rail.

17. The method of claim 15, wherein the trench has slanted-and-straight edges.

18. A method of forming an integrated circuit structure, the method comprising:
- etching a semiconductor substrate from a front side to form two semiconductor strips, wherein the two semiconductor strips are over a bulk portion of the semiconductor substrate;
- etching the bulk portion to form a trench in the bulk portion of the semiconductor substrate;
- forming a liner dielectric layer lining the trench;
- depositing a buried contact in the trench;
- forming a buried power rail over and connected to the buried contact, wherein the buried power rail is between the two semiconductor strips;
- forming isolation regions on opposite sides of the two semiconductor strips, wherein the buried power rail is underlying a portion of the isolation regions; and
- forming a contact plug from a backside of the semiconductor substrate, wherein the contact plug is electrically connected to the buried contact.

19. The method of claim 18, wherein the forming the contact plug comprises:
- etching the semiconductor substrate from the backside to form a contact opening, until the buried contact is exposed; and
- filling a conductive material into the contact opening.

20. The method of claim 19 further comprising, after the buried contact is exposed and before the filling the conductive material, removing a bottom portion of the contact plug.

* * * * *